(12) United States Patent  
Ise

(10) Patent No.: US 12,412,814 B2  
(45) Date of Patent: Sep. 9, 2025

(54) SEMICONDUCTOR APPARATUS

(71) Applicant: ROHM CO., LTD., Kyoto (JP)

(72) Inventor: Kota Ise, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 350 days.

(21) Appl. No.: 18/006,695

(22) PCT Filed: Nov. 18, 2021

(86) PCT No.: PCT/JP2021/042420  
§ 371 (c)(1),  
(2) Date: Jan. 24, 2023

(87) PCT Pub. No.: WO2022/130889  
PCT Pub. Date: Jun. 23, 2022

(65) Prior Publication Data  
US 2023/0275006 A1 Aug. 31, 2023

(30) Foreign Application Priority Data

Dec. 15, 2020 (JP) .................. 2020-207600

(51) Int. Cl.  
*H01L 23/495* (2006.01)  
*H01L 23/00* (2006.01)  
(Continued)

(52) U.S. Cl.  
CPC .. *H01L 23/49537* (2013.01); *H01L 23/49838* (2013.01); *H01L 24/40* (2013.01);  
(Continued)

(58) Field of Classification Search  
CPC ......... H01L 23/49537; H01L 23/49838; H01L 24/40; H01L 24/48; H01L 24/73;  
(Continued)

(56) References Cited

U.S. PATENT DOCUMENTS

2013/0214399 A1 8/2013 Joshi et al.

FOREIGN PATENT DOCUMENTS

JP 2013-149760 A 8/2013  
JP 2014-82834 A 5/2014

OTHER PUBLICATIONS

International Search Report issued in PCT/JP2021/042420, Feb. 15, 2022 (2 pages).

(Continued)

*Primary Examiner* — Elias Ullah  
(74) *Attorney, Agent, or Firm* — HSML P.C.

(57) ABSTRACT

A semiconductor device includes a semiconductor element, a conductive member and a connecting member. The semiconductor element has a reverse surface formed with a first electrode and an obverse surface formed with a second electrode and a third electrode. The reverse surface and the obverse surface are spaced apart from each other in a z direction. Current flow between the first electrode and the second electrode is on-off controlled according to a first drive signal inputted to the third electrode. The conductive member has a first bond surface and a second bond surface each facing in the same direction as the reverse surface. The third electrode is bonded to the first bond surface. The connecting member is bonded to the second bond surface, and the second bond surface does not overlap with the semiconductor element as viewed in the z direction.

17 Claims, 21 Drawing Sheets

(51) Int. Cl.
*H01L 23/498* (2006.01)
*H01L 25/07* (2006.01)

(52) U.S. Cl.
CPC .............. *H01L 24/48* (2013.01); *H01L 24/73* (2013.01); *H01L 25/074* (2013.01); *H01L 2224/40245* (2013.01); *H01L 2224/48247* (2013.01); *H01L 2224/73221* (2013.01); *H01L 2924/13055* (2013.01); *H01L 2924/13064* (2013.01); *H01L 2924/13091* (2013.01); *H01L 2924/181* (2013.01)

(58) Field of Classification Search
CPC ......... H01L 25/074; H01L 2224/40245; H01L 2224/48247; H01L 2224/73221; H01L 2924/13055; H01L 2924/13064; H01L 2924/13091; H01L 2924/181; H01L 23/49524; H01L 23/49531; H01L 23/49562; H01L 23/49575; H01L 25/18; H01L 2224/0603; H01L 2224/06181; H01L 2224/48091; H01L 2224/48472
See application file for complete search history.

(56) References Cited

OTHER PUBLICATIONS

Office Action issued in corresponding Japanese Patent application No. 2022-569799, Aug. 5, 2025, and machine translation (9 pages).

SEMICONDUCTOR APPARATUS

TECHNICAL FIELD

The present disclosure relates to a semiconductor device.

BACKGROUND ART

An example of a conventional semiconductor device is disclosed in Patent Document 1. The semiconductor device disclosed in this document includes a semiconductor element, a chip mount portion (tab), a metal clip, a wire, and a plurality of leads. In this semiconductor device, the semiconductor element is a MOSFET (Metal Oxide Semiconductor Field Effect Transistor). The semiconductor element has a drain electrode, a source electrode and a gate electrode. In the semiconductor device, current flow between the drain electrode and the source electrode is on-off controlled according to a drive signal input to the gate electrode. The source electrode and the gate electrode are formed on the obverse surface of the semiconductor element, and the drain electrode is formed on the reverse surface of the semiconductor element. The drain electrode is electrically connected to the chip mount portion when the semiconductor element is mounted to the chip mount portion. The chip mount portion is integrally formed on one of the leads. The source electrode is electrically connected to one of the leads with the metal clip. The gate electrode is electrically connected to one of the leads with the wire.

TECHNICAL REFERENCE

Patent Document

Patent Document 1: JP-A-2014-82384

SUMMARY OF THE INVENTION

Problems to be Solved by the Invention

When the conventional semiconductor element described above is mounted on a support member by e.g. flip chip bonding, the obverse surface faces downward in the semiconductor device. Accordingly, the gate electrode faces downward in the semiconductor device, making it difficult to directly bond a wire to the gate electrode. Thus, in the conventional semiconductor device, there is still room for improvement in wiring.

In light of the above circumstances, the present disclosure aims to provide a semiconductor device that allows easy wiring to an electrode even when the electrode (e.g., an input electrode for a drive signal) faces downward.

Means for Solving the Problems

A semiconductor device according to the present disclosure includes: a first semiconductor element having a first electrode, a second electrode and a third electrode and configured such that current flow between the first electrode and the second electrode is on-off controlled according to a first drive signal inputted to the third electrode; a first conductive member bonded to the third electrode; and a first connecting member bonded to the first conductive member. The first semiconductor element has a first obverse surface and a first reverse surface spaced apart from each other in a thickness direction of the first semiconductor element. The second electrode and the third electrode are formed on the first obverse surface, and the first electrode is formed on the first reverse surface. The first conductive member has a first bond surface and a second bond surface each facing in a same direction as the first reverse surface along the thickness direction and spaced apart from each other, and also has a recessed surface recessed in the thickness direction with respect to the first bond surface and the second bond surface. The third electrode is bonded to the first bond surface. The first connecting member is bonded to the second bond surface, and the second bond surface does not overlap with the first semiconductor element as viewed in the thickness direction.

Advantages of the Invention

The above configuration allows easy wiring to an input electrode for a drive signal that performs on-off control of a semiconductor element in a semiconductor device.

MODE FOR CARRYING OUT THE INVENTION

Figure 1:
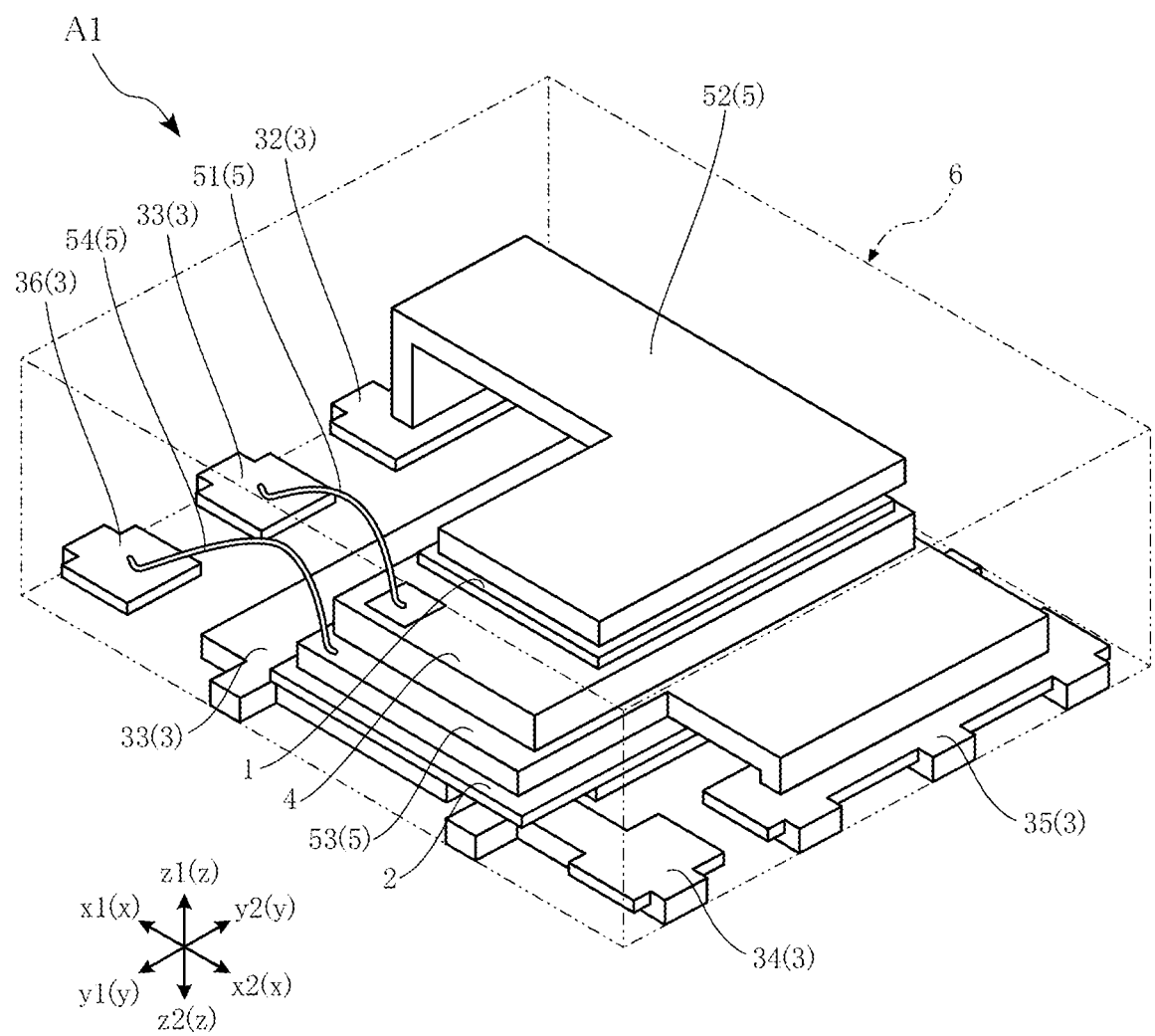
FIG. 1 is a perspective view of a semiconductor device according to a first embodiment.

Preferred embodiments of a semiconductor device according to the present disclosure are described below with reference to the accompanying drawings. In the description given below, the elements that are identical or similar are denoted by the same reference signs, and duplicate explanations are omitted as appropriate.

FIGS. 1 to 14 show a semiconductor device A1 according to a first embodiment. The semiconductor device A1 includes a first semiconductor element 1, a second semiconductor element 2, a plurality of leads 3, a conductor 4, a plurality of connecting members 5 and a sealing member 6. In the semiconductor device A1, the plurality of leads 3 include a first lead 31, a second lead 32, a third lead 33, a fourth lead 34, a fifth lead 35 and a sixth lead 36, and the plurality of connecting members 5 include a first connecting member 51, a second connecting member 52, a third connecting member 53 and a fourth connecting member 54.

Figure 2:
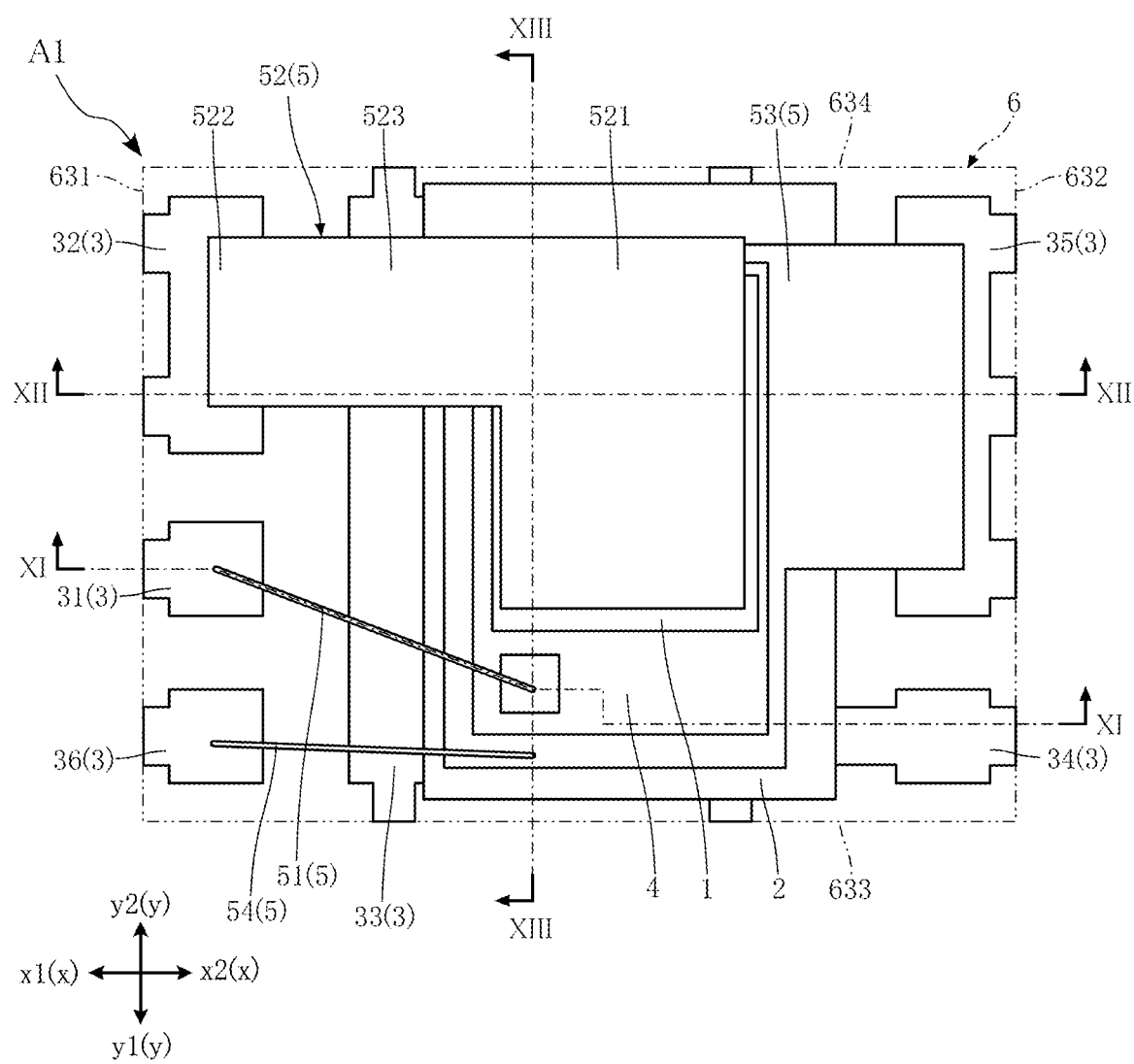
FIG. 2 is a plan view of the semiconductor device according to the first embodiment.
Figure 3:
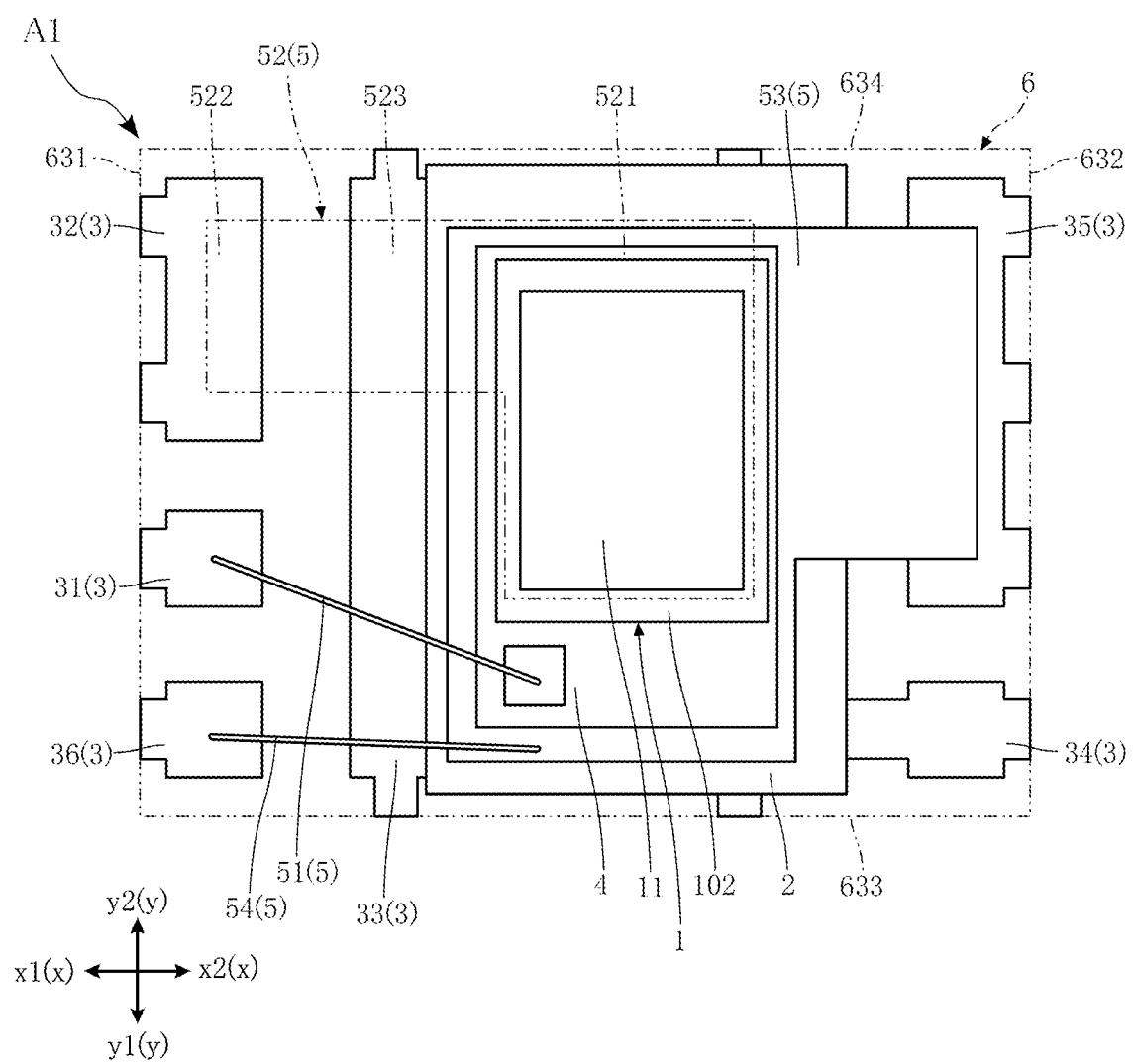
FIG. 3 is a plan view of the semiconductor device according to the first embodiment.
Figure 4:
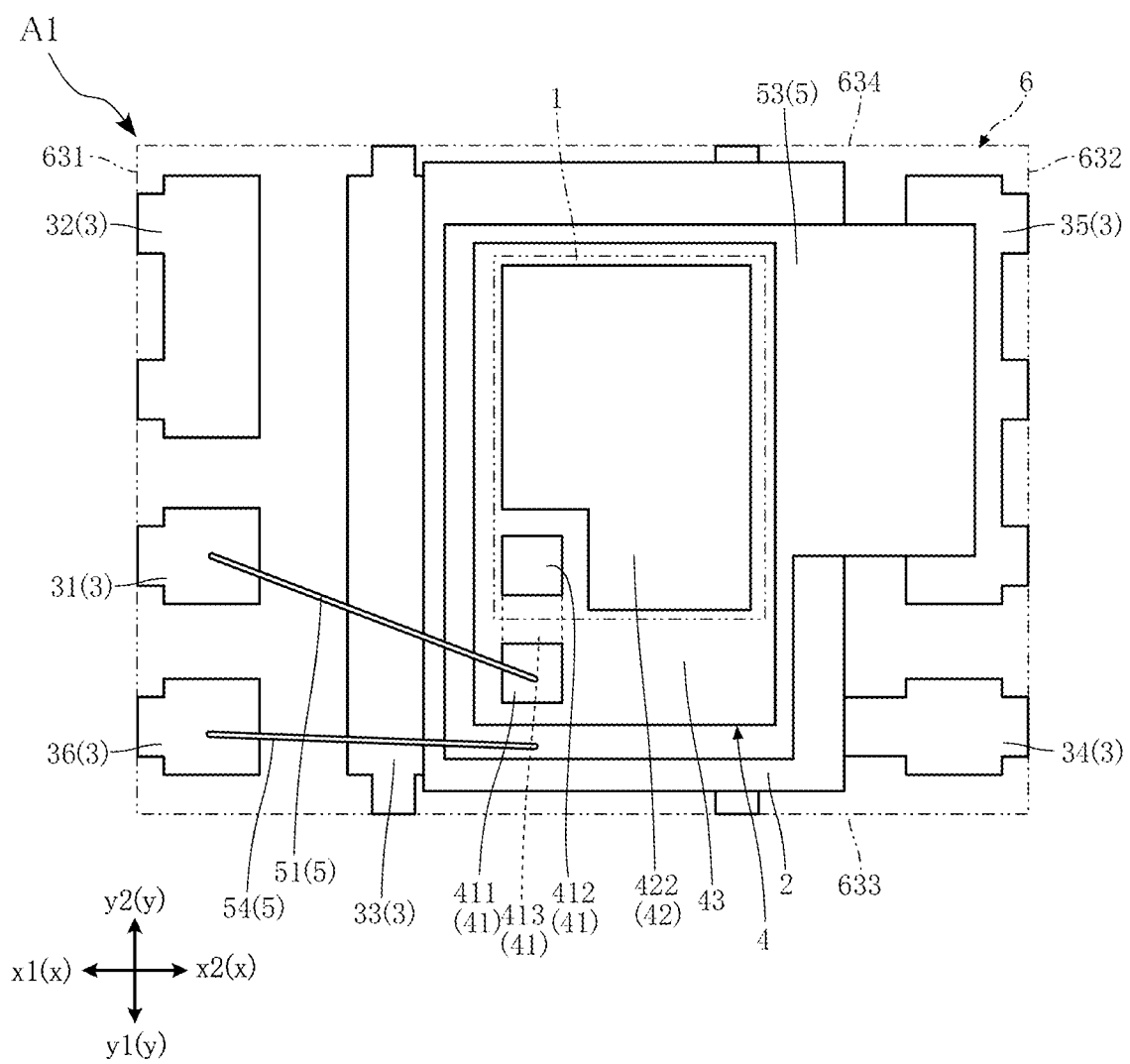
FIG. 4 is a plan view of the semiconductor device according to the first embodiment.
Figure 5:
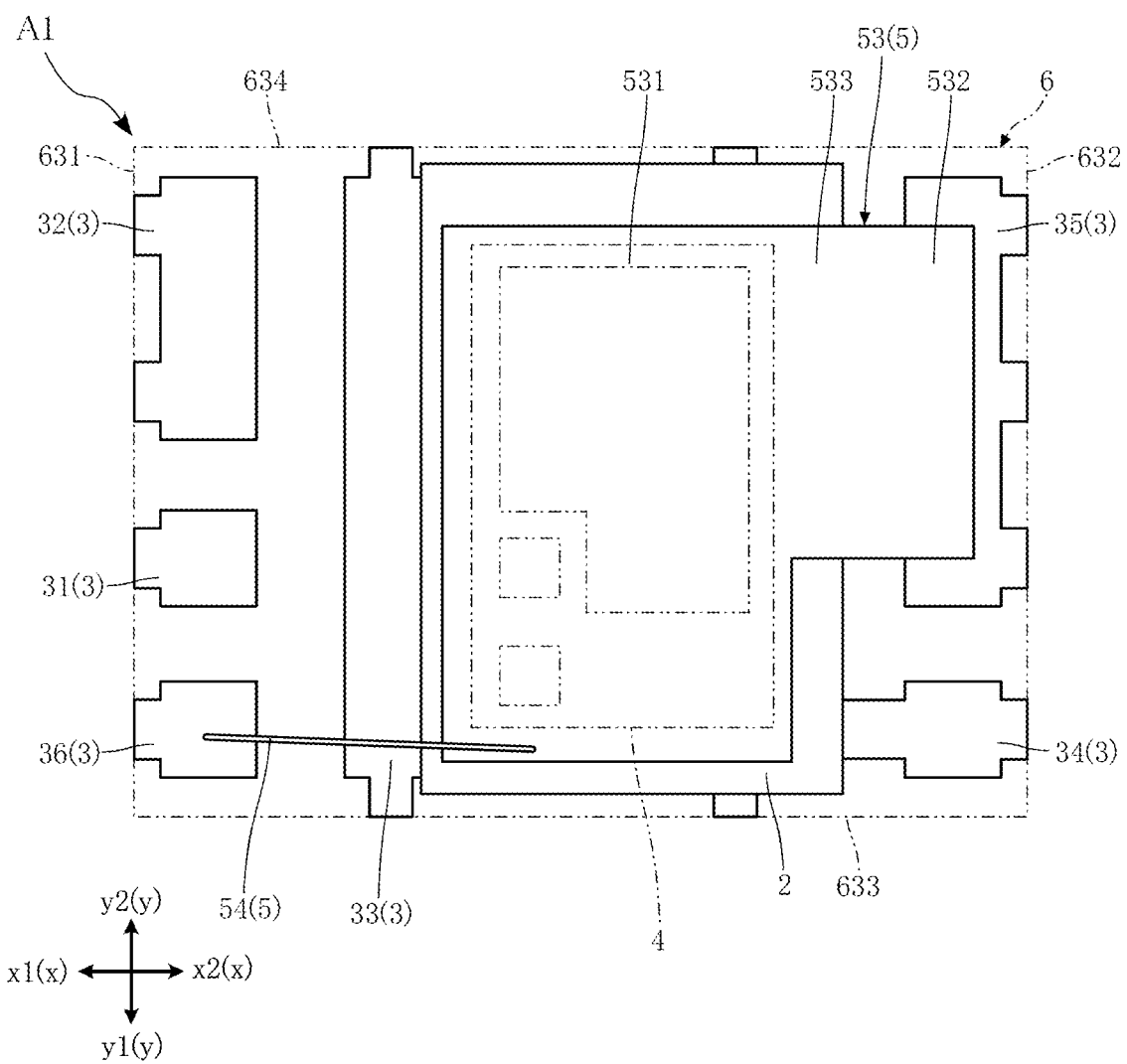
FIG. 5 is a plan view of the semiconductor device according to the first embodiment.
Figure 6:
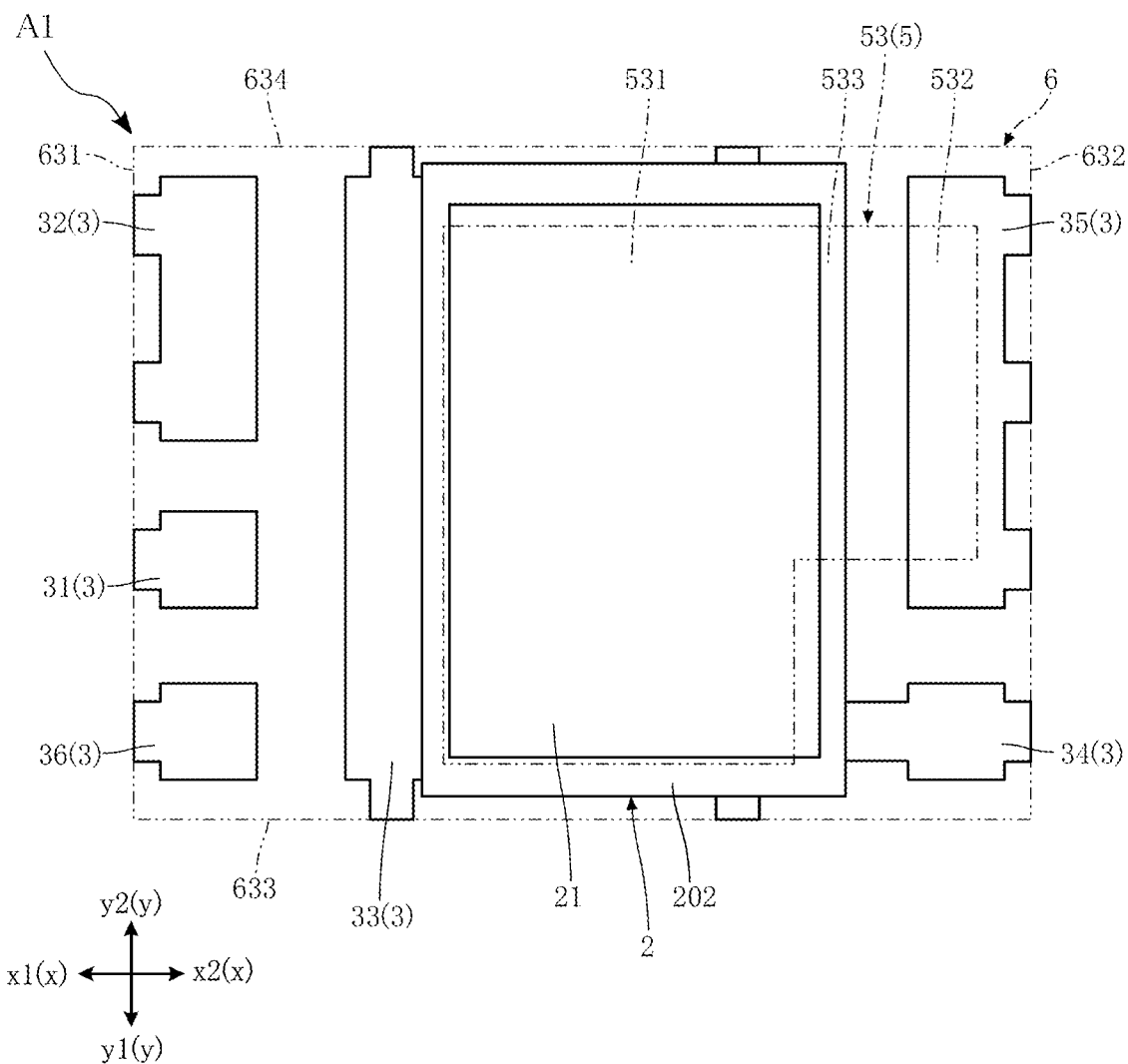
FIG. 6 is a plan view of the semiconductor device according to the first embodiment.
Figure 7:
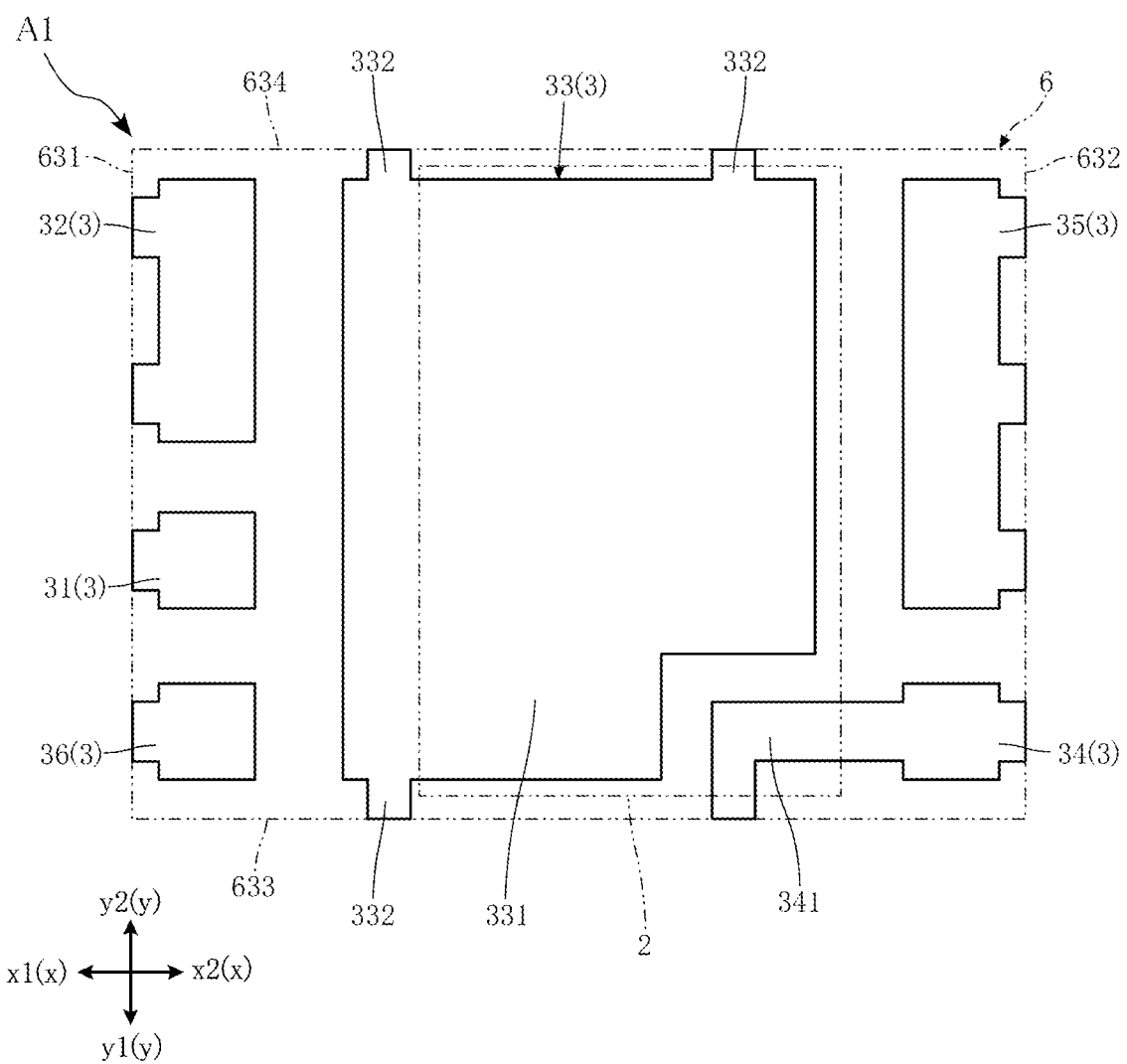
FIG. 7 is a plan view of the semiconductor device according to the first embodiment.
Figure 8:
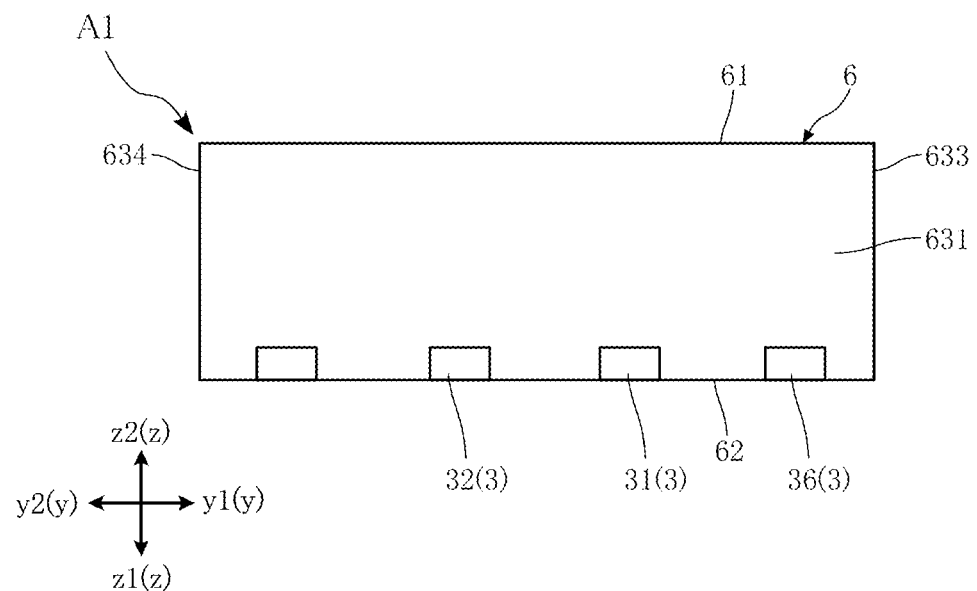
FIG. 8 is a left side view of the semiconductor device according to the first embodiment.
Figure 9:
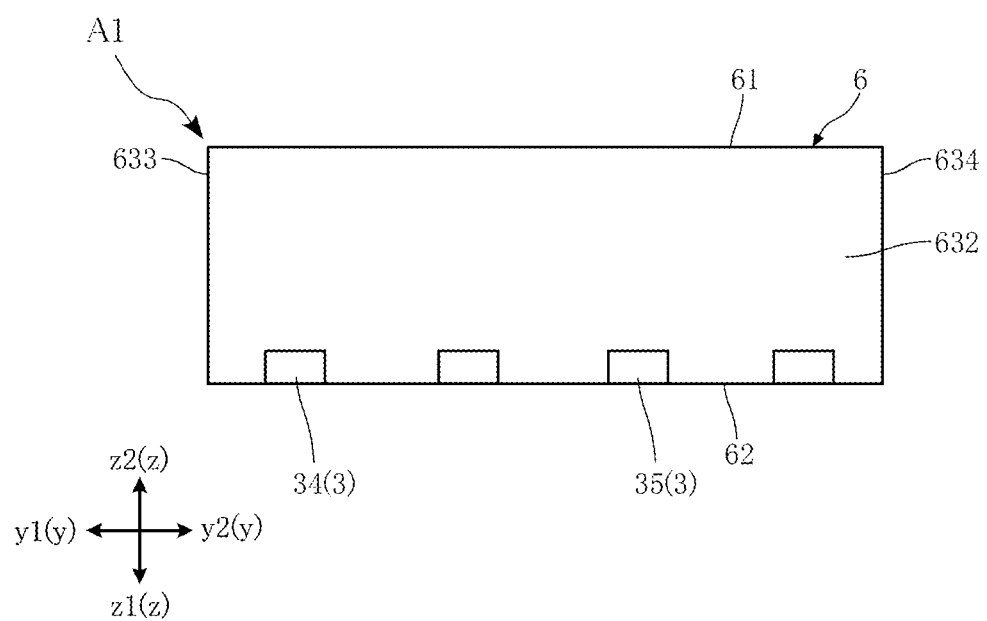
FIG. 9 is a right side view of the semiconductor device according to the first embodiment.
Figure 10:
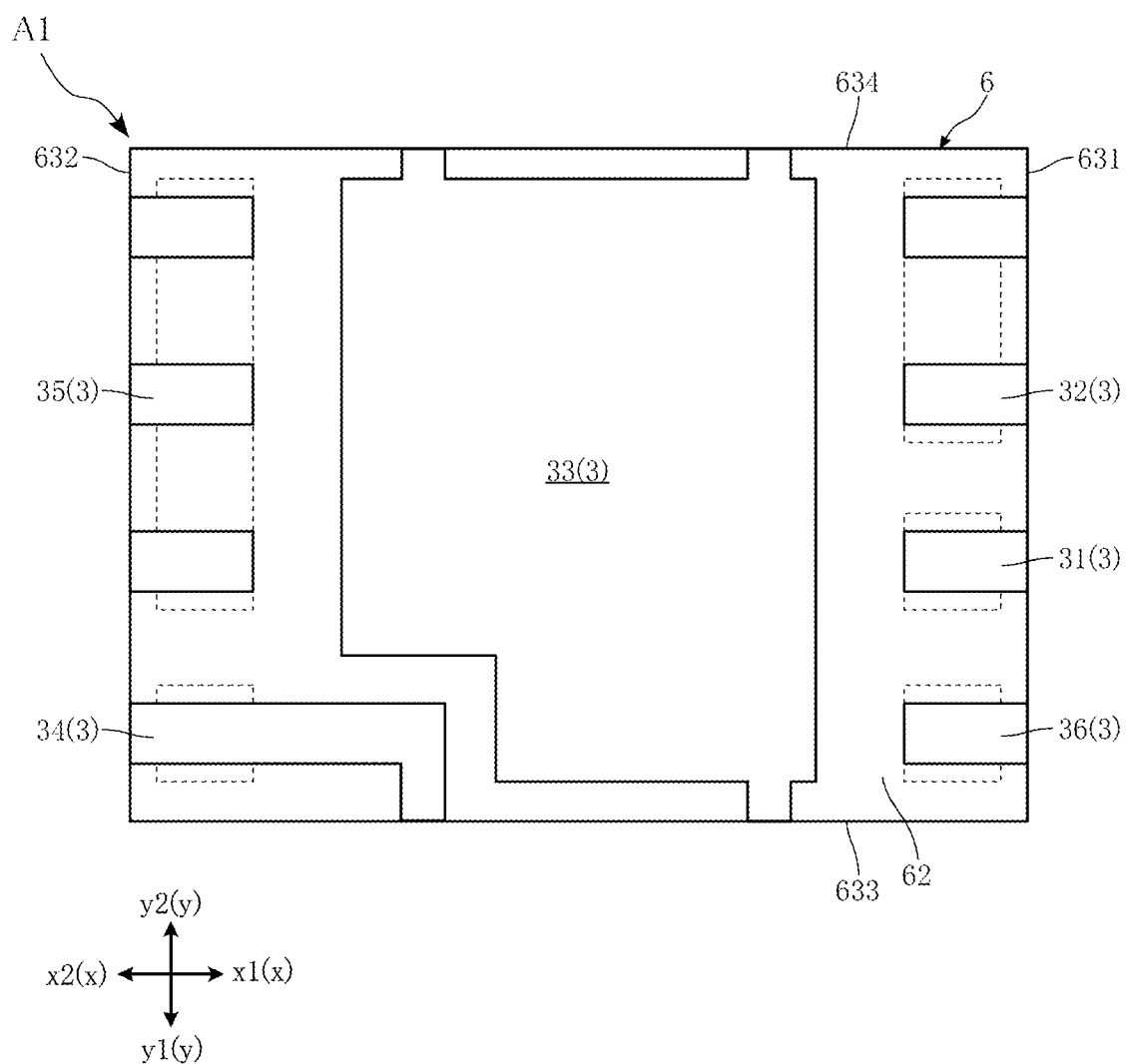
FIG. 10 is a bottom view of the semiconductor device according to the first embodiment.
Figure 11:
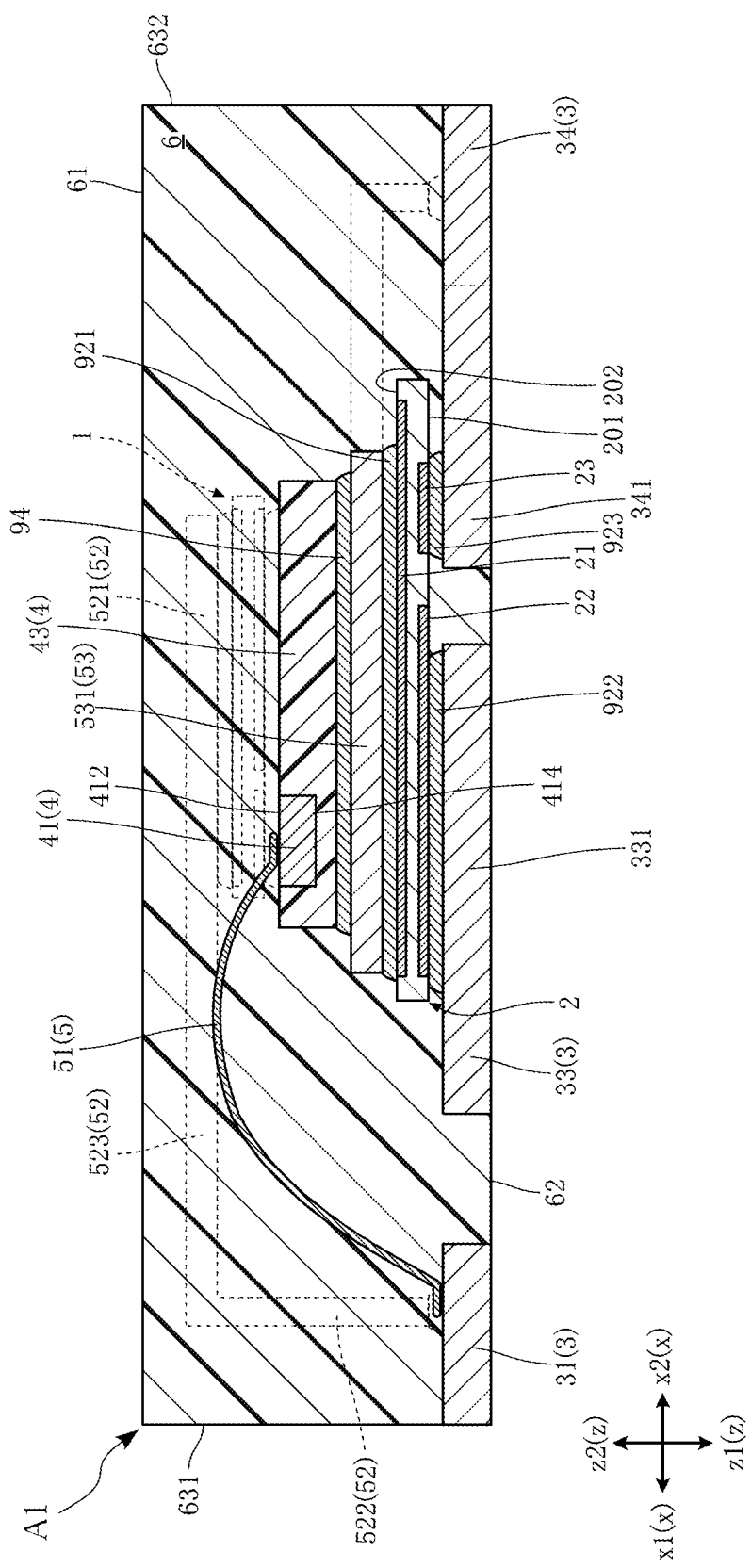
FIG. 11 is a sectional view taken along line XI-XI in FIG. 2.
Figure 12:
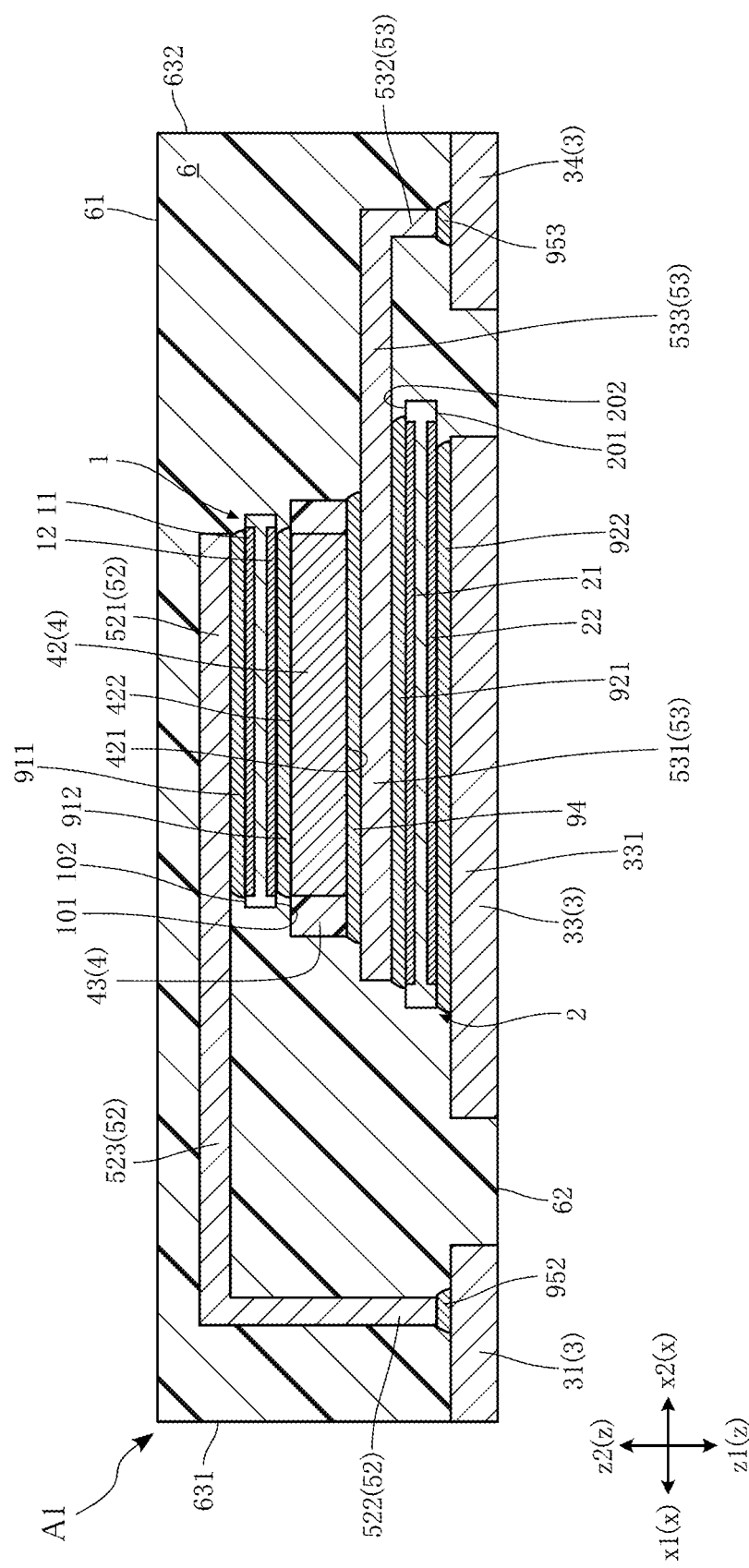
FIG. 12 is a sectional view taken along line XII-XII in FIG. 2.
Figure 13:
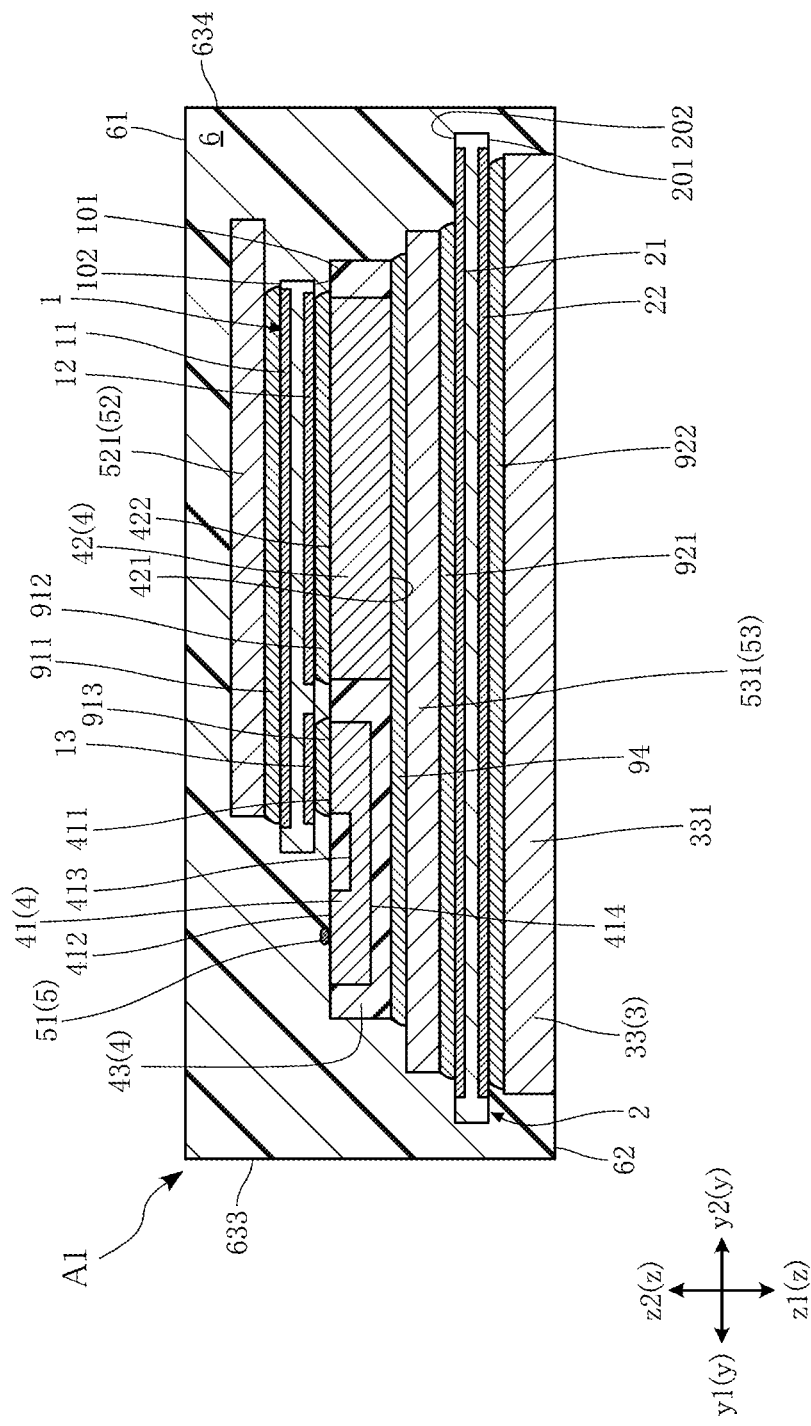
FIG. 13 is a sectional view taken along line XIII-XIII in FIG. 2.
Figure 14:
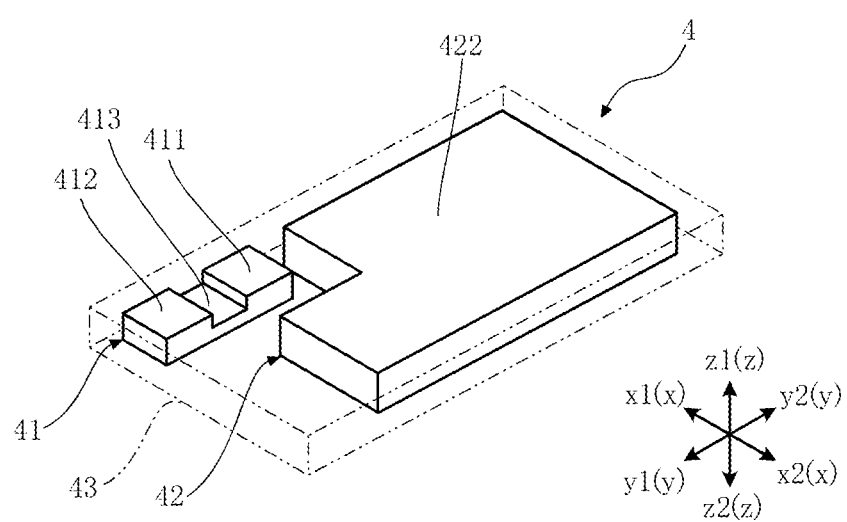
FIG. 14 is a perspective view showing a conductor of the semiconductor device according to the first embodiment.

FIG. 1 is a perspective view of the semiconductor device A1, in which the sealing member 6 is shown by imaginary lines (two-dot chain lines). FIG. 2 is a plan view of the semiconductor device A1, in which the sealing member 6 is shown by imaginary lines. FIG. 3 is a plan view corresponding to FIG. 2, in which the second connecting member 52 is also shown by imaginary lines. FIG. 4 is a plan view corresponding to FIG. 3, in which the second connecting member 52 is omitted while the first semiconductor element 1 is shown by imaginary lines. FIG. 5 is a plan view corresponding to FIG. 4, in which the first semiconductor element 1 is omitted while the conductor 4 is shown by imaginary lines. FIG. 6 is a plan view corresponding to FIG. 5, in which the conductor 4 is omitted while the third connecting member 53 is shown by imaginary lines. FIG. 7 is a plan view corresponding to FIG. 6, in which the third connecting member 53 is omitted while the second semiconductor element 2 is shown by imaginary lines. FIG. 8 is a left side view of the semiconductor device A1. FIG. 9 is a right side view of the semiconductor device A1. FIG. 10 is a bottom view of the semiconductor device A1. FIG. 11 is a sectional view taken along line XI-XI in FIG. 2. FIG. 12 is a sectional view taken along line XII-XII in FIG. 2. FIG. 13 is a sectional view taken along line XIII-XIII in FIG. 2. FIG. 14 is a perspective view of the conductor 4, in which part of the conductor 4 (the resin member 43 described later) is shown by imaginary lines.

For convenience of explanation, the description below refers to three mutually orthogonal directions, i.e., x direction, y direction and z direction, as appropriate. The z direction may correspond to the thickness direction of the semiconductor device A1.

Each of the first semiconductor element 1 and the second semiconductor element 2 is a MOSFET. Alternatively, each of the first semiconductor element 1 and the second semiconductor element 2 may be a field-effect transistor including a MISFET (Metal-Insulator-Semiconductor FET) and a HEMT (High Electron Mobility Transistor), or a bipolar transistor such as an IGBT. Each of the first semiconductor element 1 and the second semiconductor element 2 is made of SiC (silicon carbide), for example. Alternatively, each of the first semiconductor element 1 and the second semiconductor element 2 may be made of silicon (Si), gallium arsenide (GaN), or gallium nitride (GaN). The first semiconductor element 1 and the second semiconductor element 2 may be rectangular as viewed in the z direction (i.e., in plan view). As shown in FIGS. 3, 6, 12 and 13, the first semiconductor element 1 is smaller in size in plan view than the second semiconductor element 2. In plan view, the entirety of the first semiconductor element 1 overlaps with the second semiconductor element 2.

As shown in FIGS. 12 and 13, the first semiconductor element 1 has a first obverse surface 101 and a first reverse surface 102. The first obverse surface 101 and the first reverse surface 102 are spaced apart from each other in the z direction. In the semiconductor device A1, the first semiconductor element 1 is disposed such that the first obverse surface 101 faces in the z1 direction and the first reverse surface 102 faces in the z2 direction.

As shown in FIGS. 12 and 13, the first semiconductor element 1 has a first electrode 11, a second electrode 12 and a third electrode 13. The first electrode 11 is formed on the first reverse surface 102, and the second electrode 12 and the third electrode 13 are formed on the first obverse surface 101. In the example in which the first semiconductor element 1 is a MOSFET, the first electrode 11 is a drain electrode, the second electrode 12 is a source electrode, and the third electrode 13 is a gate electrode. In the first semiconductor element 1, a first drive signal (e.g., a gate voltage) is input to the third electrode 13 (gate electrode) to conduct the on-off control of current flow between the first electrode 11 (drain electrode) and the second electrode 12 (source electrode). That is, when a first drive signal (e.g., gate voltage) is input to the third electrode 13 (gate electrode), the first semiconductor element 1 switches between a conducting state and a blocked state according to the first drive signal. The operation to switch between the conduction state and the blocked state is called a switching operation. In the conduction state, a current flows from the first electrode 11 (drain electrode) to the second electrode 12 (source electrode). In the blocked state, the current does not flow.

As shown in FIGS. 11 to 13, the second semiconductor element 2 has a second obverse surface 201 and a second reverse surface 202. The second obverse surface 201 and the second reverse surface 202 are spaced apart from each other in the z direction. In the semiconductor device A1, the second semiconductor element 2 is disposed such that the second obverse surface 201 faces in the z1 direction and the second reverse surface 202 faces in the z2 direction.

As shown in FIGS. 11 to 13, the second semiconductor element 2 has a fourth electrode 21, a fifth electrode 22 and a sixth electrode 23. The fourth electrode 21 is formed on the second reverse surface 202, and the fifth electrode 22 and the sixth electrode 23 are formed on the second obverse surface 201. In the example in which the second semiconductor element 2 is a MOSFET, the fourth electrode 21 is a drain electrode, the fifth electrode 22 is a source electrode, and the sixth electrode 23 is a gate electrode. In the second semiconductor element 2, a second drive signal (e.g., a gate voltage) is input to the sixth electrode 23 (gate electrode) to conduct the on-off control of current flow between the fourth electrode 21 (drain electrode) and the fifth electrode 22 (source electrode). That is, when a second drive signal (e.g., gate voltage) is input to the sixth electrode 23 (gate electrode), the second semiconductor element 2 switches between a conducting state and a blocked state according to the second drive signal. In the conduction state, a current flows from the fourth electrode 21 (drain electrode) to the fifth electrode 22 (source electrode). In the blocked state, the current does not flow.

The semiconductor device A1 converts DC voltage to AC voltage by the switching operations of the first semiconductor element 1 and the second semiconductor element 2. In the semiconductor device A1, DC voltage is input between the second lead 32 and the third lead 33, and AC voltage is output from the fifth lead 35. The path of the current generated by the DC voltage and the path of the current generated by the AC voltage are the main current path in the semiconductor device A1. The semiconductor device A1 is configured as a half-bridge switching circuit, for example. In this case, the first semiconductor element 1 constitutes an upper arm circuit of the semiconductor device A1, and the second semiconductor element 2 constitutes a lower arm circuit of the semiconductor device A1. The first semiconductor element 1 and the second semiconductor element 2 are connected in series to form a bridge.

The plurality of leads 3 support the first semiconductor element 1 and the second semiconductor element 2 and are electrically connected to the first semiconductor element 1 and the second semiconductor element 2 as appropriate. As shown in FIGS. 11 to 13, the leads 3 are located on the opposite side of the first semiconductor element 1 with respect to the second semiconductor element 2 in the z direction. The leads are made of an electrically conductive material and may be formed by using a lead frame. For example, the leads 3 are formed by subjecting a plate made of a metal such as Cu or a Cu alloy to a cutting process such as punching and a bending process. As shown in FIGS. 8 to 10, the leads 3 are partially exposed from the sealing member 6, and the exposed portions are used as the terminals of the semiconductor device A1. As mentioned above, the leads 3 include the first lead 31, the second lead 32, the third lead 33, the fourth lead 34, the fifth lead 35 and the sixth lead 36. The first lead 31, the second lead 32, the third lead 33, the fourth lead 34, the fifth lead 35 and the sixth lead 36 are spaced apart from each other.

The first lead 31 is electrically connected to the third electrode 13 (gate electrode) of the first semiconductor element 1. As shown in FIGS. 8 and 10, a part of the first lead 31 is exposed from the sealing member 6. The exposed part is a terminal of the semiconductor device A1. In the semiconductor device A1, the first lead 31 is the input terminal for a first drive signal.

The second lead 32 is electrically connected to the first electrode 11 (drain electrode) of the first semiconductor element 1. As shown in FIGS. 8 and 10, a part of the second lead 32 is exposed from the sealing member 6. The exposed part is a terminal of the semiconductor device A1. In the semiconductor device A1, the second lead 32 is the input terminal on the positive side (P terminal).

The third lead 33 is electrically connected to the fifth electrode 22 (source electrode) of the second semiconductor element 2. As shown in FIG. 10, a part of the third lead 33 is exposed from the sealing member 6. The exposed part is a terminal of the semiconductor device A1. In the semiconductor device A1, the third lead 33 is the input terminal on the negative side (N terminal). As shown in FIGS. 11 to 13, the fifth electrode 22 of the second semiconductor element 2 is bonded to the third lead 33 with a conductive bonding material 922. Thus, the semiconductor element 2 is mounted on the third lead 33. The conductive bonding material 922, which may be omitted in FIGS. 1 to 7, may include solder, metal paste or sintered metal, for example.

As shown in FIG. 7, the third lead 33 includes a pad portion 331 and a plurality of suspending portions 332. As shown in FIGS. 11 to 13, the fifth electrode 22 of the second semiconductor element 2 is bonded to the pad portion 331 of the third lead 33 with the conductive bonding material 922. The suspending portions 332 are the portions that support the pad portion 331 when the leads 3 are in the form of a lead frame during the manufacture of the semiconductor device A1. Each of the suspending portions 332 is exposed from the sealing member 6 at its surface on the opposite side of the portion connected to the pad portion 331 in the y direction.

The fourth lead 34 is electrically connected to the sixth electrode 23 (gate electrode) of the second semiconductor element 2. As shown in FIGS. 9 and 10, a part of the fourth lead 34 is exposed from the sealing member 6. The exposed part is a terminal of the semiconductor device A1. In the semiconductor device A1, the fourth lead 34 is the input terminal for a second drive signal.

As shown in FIG. 7, the fourth lead 34 includes a pad portion 341. The sixth electrode 23 of the second semiconductor element 2 is bonded to the pad portion 341 of the fourth lead 34. As shown in FIG. 11, the sixth electrode 23 is bonded to the pad portion 341 with a conductive bonding material 923. The conductive bonding material 923 may include solder, metal paste or sintered metal, for example.

The fifth lead 35 is electrically connected to the second electrode 12 (source electrode) of the first semiconductor element 1 and the fourth electrode 21 (drain electrode) of the second semiconductor element 2. As shown in FIGS. 9 and 10, a part of the fifth lead 35 is exposed from the sealing member 6. The exposed part is a terminal of the semiconductor device A1. In the semiconductor device A1, the fifth lead 35 is the output terminal for AC voltage.

The sixth lead 36 is electrically connected to the fourth electrode 21 (drain electrode) of the second semiconductor element 2. As shown in FIGS. 8 and 10, a part of the sixth lead 36 is exposed from the sealing member 6. The exposed part is a terminal of the semiconductor device A1. In the semiconductor device A1, the sixth lead 36 is a terminal for detecting the output voltage.

As shown in FIG. 7, in the semiconductor device A1, the third lead 33 is located in the center (or generally in the center) of the semiconductor device A1 in the x direction and is continuous in the y direction. The first lead 31, the second lead 32 and the sixth lead 36 are offset from the third lead 33 toward one side in the x direction (i.e., in the x1 direction). The fourth lead 34 and the fifth lead 35 are offset from the third lead 33 toward the other side in the x direction (i.e., in the x2 direction). The first lead 31, the second lead 32 and the sixth lead 36 are aligned in the y direction, with the first lead 31 flanked by the second lead 32 and the sixth lead 36 in the y direction. The second lead 32 is offset from the first lead 31 toward one side in the y direction (i.e., in the y2 direction). The fourth lead 34 is offset from the fifth lead 35 toward the other side in the y direction (i.e., in the y1 direction). The sixth lead 36 overlaps with the fourth lead 34 as viewed in the x direction. Each of the first lead 31 and the second lead 32 overlaps with the fifth lead 35 as viewed in the x direction. The shape and arrangement of each lead 3 (the first lead 31, the second lead 32, the third lead 33, the fourth lead 34, the fifth lead 35 and the sixth lead 36) are not limited to the illustrated example.

As shown in FIGS. 11 to 13, the conductor 4 is located between the first semiconductor element 1 and the second semiconductor element 2 in the z direction. As shown in FIGS. 4 and 11 to 14, the conductor 4 includes a first conductive member 41, a second conductive member 42 and a resin member 43.

The first conductive member 41 is made of an electrically conductive material. Examples of the electrically conductive material include Cu and a Cu alloy. As shown in FIGS. 4 and 11 to 13, the first conductive member 41 has a first bond surface 411, a second bond surface 412, a recessed surface 413 and a covered surface 414.

As shown in FIG. 13, the first bond surface 411 and the second bond surface 412 face in the z2 direction. That is, the first bond surface 411 and the second bond surface 412 face in the same direction as the first reverse surface 102 and the second reverse surface 202 in the z direction. As shown in FIG. 4, in plan view, the first bond surface 411 overlaps with the first semiconductor element 1, while the second bond surface 412 does not overlap with the first semiconductor element 1. The first bond surface 411 does not overlap with the second connecting member 52 in plan view. As shown in FIG. 13, the third electrode 13 of the first semiconductor element 1 is bonded to the first bond surface 411 with a conductive bonding material 913. The conductive bonding material 913 may include solder, metal paste or sintered metal, for example. As shown in FIG. 11, the first connecting member 51 is bonded to the second bond surface 412. In the semiconductor device A1, the first bond surface 411 and the second bond surface 412 are in the same plane perpendicular to the z direction. The first bond surface 411 and the second bond surface 412 are spaced apart from each other along the y direction.

As shown in FIGS. 13 and 14, the recessed surface 413 is flanked by the first bond surface 411 and the second bond surface 412 in plan view and recessed with respect to the first bond surface 411 and the second bond surface 412 in the z direction. In the example shown in FIGS. 13 and 14, the recessed surface 413 is defined by a plurality of flat surfaces (e.g., a bottom surface and a pair of side surfaces). However, the recessed surface 413 may be curved as a whole. (For example, one of the above-noted surfaces may be curved or two or three surfaces may be curved.) The resin member 43 is in the space defined by the recessed surface 413.

As shown in FIG. 13, the covered surface 414 is covered with the resin member 43. The covered surface 414 faces in the z1 direction. That is, the covered surface 414 faces away from the first bond surface 411 and the second bond surface 412 in the z direction.

The second conductive member 42 is made of an electrically conductive material. As with the first conductive member 41, examples of the electrically conductive material include Cu and a Cu alloy. The second conductive member 42 is spaced apart and insulated from the first conductive member 41. The second conductive member 42 is located between the first semiconductor element 1 and the second semiconductor element 2 in the z direction.

As shown in FIGS. 12 and 13, the second conductive member 42 has a first end surface 421 and a second end surface 422. The first end surface 421 and the second end surface 422 are spaced apart from each other in the z direction. The first end surface 421 faces in the z1 direction, and the second end surface 422 faces in the z2 direction. As shown in FIGS. 12 and 13, the first end surface 421 is bonded to the third connecting member 53 with a conductive bonding material 94. The conductive bonding material 94 may include solder, metal paste or sintered metal, for example. As shown in FIGS. 12 and 13, the second end surface 422 is bonded to the second electrode 12 of the first semiconductor element 1 with a conductive bonding material 912. The conductive bonding material 912 may include solder, metal paste or sintered metal, for example. In the semiconductor device A1, the second end surface 422 is in the same plane, which is perpendicular to the z direction, as the first bond surface 411 and the second bond surface 412.

As shown in FIGS. 11 to 14, the resin member 43 partially covers the first conductive member 41 and the second conductive member 42. In the conductor 4, the first bond surface 411 and the second bond surface 412 of the first conductive member 41 and the first end surface 421 and the second end surface 422 of the second conductive member 42 are exposed from the resin member 43. The resin member 43 is made of an insulating resin material, for example. The resin material may be an epoxy resin, for example. Alternatively, the material for the resin member 43 may be glass epoxy resin.

Each of the plurality of connecting members 5 electrically connects two or more parts that are spaced apart from each other. As mentioned above, the connecting members 5 include the first connecting member 51, the second connecting member 52, the third connecting member 53 and the fourth connecting member 54.

The first connecting member 51 electrically connects the first conductive member 41 of the conductor 4 and the first lead 31. The first connecting member 51 may be a bonding wire. Alternatively, the first connecting member 51 may be a bonding ribbon or a metal plate, for example. The first connecting member 51 may be made of Au or a Au alloy, Cu or a Cu alloy, or Al or a Al alloy. As shown in FIG. 11, the first connecting member 51 is bonded at one end to the second bond surface 412 of the first conductive member 41 and at the other end to the upper surface of the first lead 31.

The second connecting member 52 electrically connects the first electrode 11 of the first semiconductor element 1 and the second lead 32. The second connecting member 52 is a metal plate (also referred to as a metal clip), for example. The second connecting member 52 is made of Cu or a Cu alloy, for example. The second connecting member 52 constitutes the main current path in the semiconductor device A1. A metal plate is more suitable for a large current or a high voltage than a bonding wire.

The second connecting member 52 includes two bond portions 521 and 522, and a joining portion 523. As shown in FIG. 12, the bond portion 521 is bonded to the first electrode 11 with a conductive bonding material 911. The conductive bonding material 911 may include solder, metal paste or sintered metal, for example. As shown in FIG. 12, the bond portion 522 is bonded to the second lead 32 with a conductive bonding material 952. The conductive bonding material 952 may include solder, metal paste or sintered metal, for example. The joining portion 523 is connected to the two bond portions 521 and 522, joining these portions. The two bond portions 521 and 522 are electrically connected via the joining portion 523.

The third connecting member 53 electrically connects the second conductive member 42 of the conductor 4 and the fourth electrode 21 (drain electrode) of the second semiconductor element 2 to each other, and also electrically connects these parts to the fifth lead 35. The third connecting member 53 is a metal plate (also referred to as a metal clip), for example. The third connecting member 53 is made of Cu or a Cu alloy, for example. The third connecting member 53 constitutes the main current path in the semiconductor device A1. A metal plate is more suitable for a large current or a high voltage than a bonding wire. The third connecting member 53 includes an interposed portion 531, a bond portion 532 and a joining portion 533.

As shown in FIGS. 11 to 13, the interposed portion 531 is located between the second conductive member 42 and the fourth electrode 21 in the z direction, and electrically connected to the second conductive member 42 and the fourth electrode 21. The interposed portion 531 is bonded to the fourth electrode 21 with a conductive bonding material 921. The conductive bonding material 92 may include solder, metal paste or sintered metal, for example. The second conductive member 42 is bonded to the interposed portion 531 via the conductive bonding material 94 described above. As shown in FIG. 1 (see also FIGS. 2 to 5), one end of the fourth connecting member 54 is bonded to a predetermined portion of the interposed portion 531 (a portion of the third connecting member 53) that does not overlap with any of the first semiconductor element 1, the conductor 4 and the second connecting member 52 in plan view.

As shown in FIG. 12, the bond portion 532 is bonded to the fifth lead 35 with a conductive bonding material 953. The bond portion 532 is electrically connected to the fifth lead 35 via the conductive bonding material 953. The conductive bonding material 953 may include solder, metal paste or sintered metal, for example.

As shown in FIGS. 5, 6 and 12, the joining portion 533 is connected to the interposed portion 531 and the bond portion 532, joining these portions. The interposed portion 531 and the bond portion 532 are electrically connected via the joining portion 533.

The fourth connecting member 54 electrically connects the third connecting member 53 and the sixth lead 36. The fourth connecting member 54 may be a bonding wire. Alternatively, the fourth connecting member 54 may be a bonding ribbon or a metal plate, for example. The fourth connecting member 54 may be made of Au or a Au alloy, Al or a Al alloy, or Cu or a Cu alloy. The fourth connecting member 54 is bonded at one end to the interposed portion 531 of the third conductive member 53 and at the other end to the upper surface of the sixth lead 36.

As shown in FIGS. 11 to 13, the sealing member 6 covers a part of each of the first semiconductor element 1, the second semiconductor element 2 and the leads 3, as well as the conductor 4 and the connecting members 5. The sealing member 6 is made of an insulating resin material, for example. As the resin material, use may be made of the same type of epoxy resin as the resin member 43. As shown in FIGS. 2 to 13, the sealing member 6 includes a resin obverse surface 61, a resin reverse surface 62 and a plurality of resin side surfaces 631 to 634.

As shown in FIGS. 8, 9 and 11 to 13, the resin obverse surface 61 and the resin reverse surface 62 are spaced apart from each other in the z direction. The resin obverse surface 61 faces in the z2 direction, and the resin reverse surface 62 faces in the z1 direction. Each of the resin side surfaces 631 to 634 is flanked by the resin obverse surface 61 and the resin reverse surface 62 in the z direction and connected to the resin obverse surface 61 and the resin reverse surface 62. The resin side surface 631 and the resin side surface 632 are spaced apart from each other in the x direction. The resin side surface 631 faces in the x1 direction, and the resin side surface 632 faces in the x2 direction. The resin side surface 633 and the resin side surface 634 are spaced apart from each other in the y direction. The resin side surface 633 faces in the y1 direction, and the resin side surface 634 faces in the y2 direction. Each of the leads 3 is partially exposed from the resin reverse surface 62. Also, each of the first lead 31, the second lead 32 and the third lead 33 is partially exposed from the resin side surface 631, and each of the fourth lead 34 and the fifth lead 35 is partially exposed from the resin side surfaces 632.

The effects and advantages of the semiconductor device A1 are as follows.

The semiconductor device A1 includes the first semiconductor element 1 and the first conductive member 41. The first semiconductor element 1 has the first electrode 11, the second electrode 12 and the third electrode 13, and current flow between the first electrode 11 and the second electrode 12 is on-off controlled by the first drive signal input to the third electrode 13. That is, the third electrode 13 is the input electrode for the first drive signal. The first electrode 11 is formed on the first reverse surface 102 of the first semiconductor element 1, and the second electrode 12 and the third electrode 13 are formed on the first obverse surface 101. The first conductive member 41 has the first bond surface 411 and the second bond surface 412. The first bond surface 411 and the second bond surface 412 face in the same direction as the first reverse surface 102. The first bond surface 411 is bonded to the third electrode 13, and the second bond surface 412 does not overlap with the first semiconductor element 1 in plan view. Since the second bond surface 412 faces upward in the semiconductor device A1 and does not overlap with the first semiconductor element 1, the first connecting member 51 can be easily bonded to the second bond surface 412. Thus, the semiconductor device A1 facilitates the wiring to the input electrode (third electrode 13) for the drive signal to on-off control the first semiconductor element 1.

The semiconductor device A1 includes the first semiconductor element 1 and the second semiconductor element 2. The first semiconductor element 1 overlaps with the second semiconductor element 2 in plan view. When the first semiconductor element 1 is disposed to overlap with the second semiconductor element 2 in this way, the third electrode 13 faces the second semiconductor element 2, making it difficult to directly bond the first connecting member 51 to the third electrode 13. In the semiconductor device A1, in addition to the second semiconductor element 2, the third connecting member 53 and the third lead 33 are also disposed below the first semiconductor element 1 (in the z1 direction), which further makes it difficult to bond the first connecting member 51 to the third electrode 13. In the semiconductor device A1, however, the conductor 4 (first conductive member 41) has the second bond surface 412 that faces upward, which facilitates the bonding of the first connecting member 51. That is, the semiconductor device A1 is advantageous for mounting the first semiconductor element 1 and the second semiconductor element 2 in a stacked manner while flip-chip mounting each of the first semiconductor element 1 and the second semiconductor element 2.

In the semiconductor device A1, the first conductive member 41 includes the recessed surface 413 that is recessed from the first bond surface 411 and the second bond surface 412. With such a configuration, the first conductive member 41 is conductively bonded to the first semiconductor element 1 only at the first bond surface 411 bonded to the third electrode 13 with the conductive bonding material 913. Thus, the semiconductor device A1 prevents unintended electrical connection between the first conductive member 41 and the first semiconductor element 1. For example, unintended electrical connection between the first electrode 11, which is formed on the first obverse surface 101 as with the third electrode 13, and the first conductive member 41 is prevented.

In the semiconductor device A1, the second semiconductor element 2 is flip-chip mounted, with the fifth electrode 22 (source electrode) bonded to the third lead 33. Such a configuration enhances dissipation of the heat generated by the switching operation of the second semiconductor element 2.

In the semiconductor device A1, the second bond surface 412 overlaps with the third connecting member 53 (interposed portion 531), the second semiconductor element 2 and the third lead 33 (pad portion 331). In bonding the first connecting member 51 to the second bond surface 412, a downward pressing force in the z direction is applied to the second bond surface 412. However, since the conductor 4 is supported by the third connecting member 53, the second semiconductor element 2 and the third lead 33, displacement of the conductor 4 or bonding failure of the first connecting member 51 due to such a pressing force are prevented.

Figure 15:
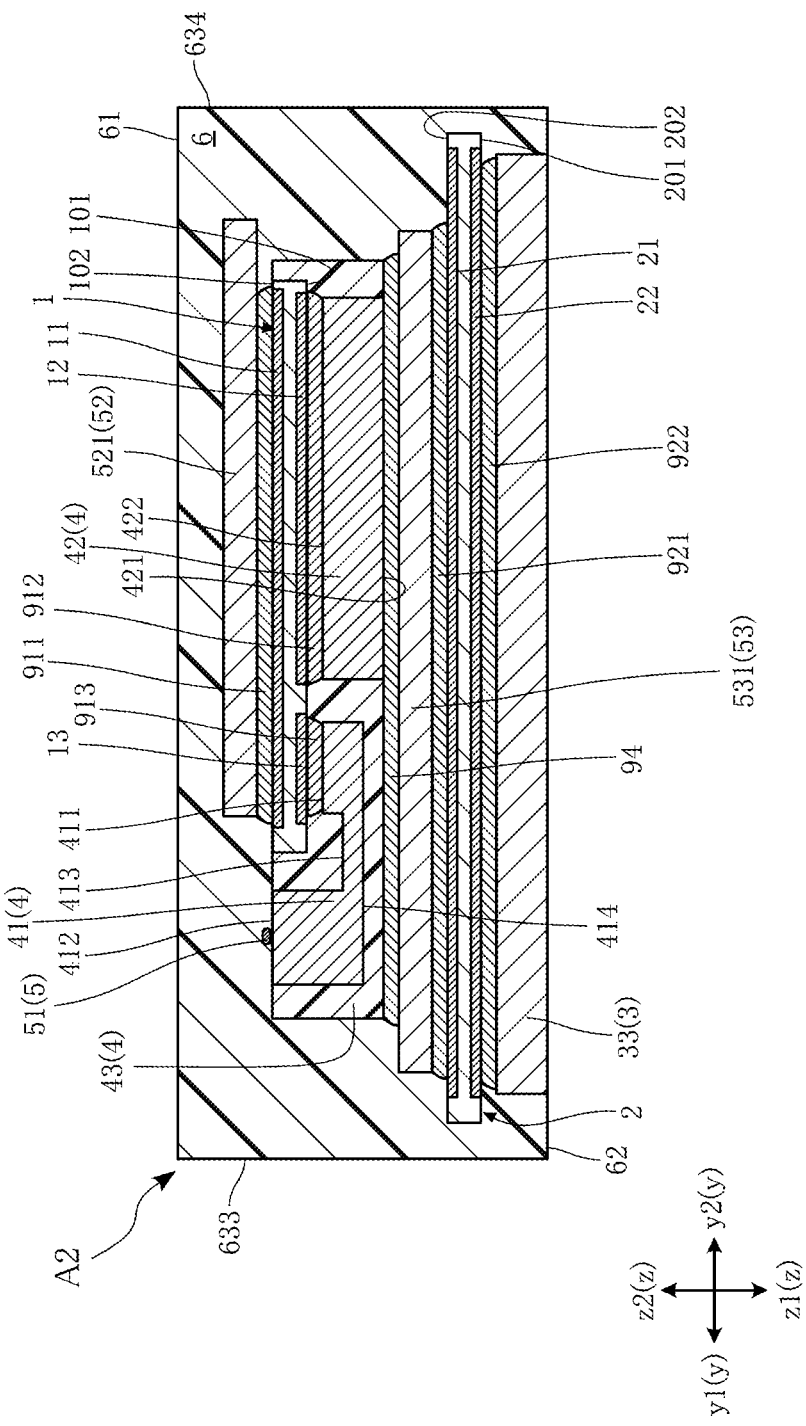
FIG. 15 is a sectional view of a semiconductor device according to a second embodiment.

FIG. 15 shows a semiconductor device A2 according to a second embodiment. FIG. 15 is a sectional view of the semiconductor device A2, corresponding to the section of FIG. 13. As shown in FIG. 15, the semiconductor device A2 differs from the semiconductor device A1 in that the first semiconductor element 1 is partially covered with the resin member 43.

In the semiconductor device A2, the resin member 43 covers the first semiconductor element 1 except the first reverse surface 102 of the first semiconductor element 1. That is, the first reverse surface 102 is exposed from the resin member 43. Since the first electrode 11 of the first semiconductor element 1 is formed on the first reverse surface 102, the first electrode 11 of the first semiconductor element 1 is exposed from the resin member 43.

As shown in FIG. 15, in the semiconductor device A2, the second bond surface 412 is located higher than the first bond surface 411 and in the same plane as the first reverse surface 102 of the first semiconductor element 1. Thus, with the first semiconductor element 1 partially covered with the resin member 43, the second bond surface 412 is exposed from the resin member 43.

During the manufacture the semiconductor device A2, the first semiconductor element 1 is integrally formed on the conductor 4 in advance. For example, after the first conductive member 41 is bonded to the third electrode 13 of the first semiconductor element 1 and the second conductive member 42 is bonded to the second electrode 12 of the first semiconductor element 1, the first conductive member 41 and the second conductive member 42 are covered with the resin member 43. Thus, the conductor 4 integrally formed with the first semiconductor element 1 is obtained. In this way, the semiconductor device A2 is manufactured by preparing in advance the conductor 4 integrally formed with the first semiconductor element 1.

The semiconductor device A2 provides the same advantages as the semiconductor device A1.

Figure 16:
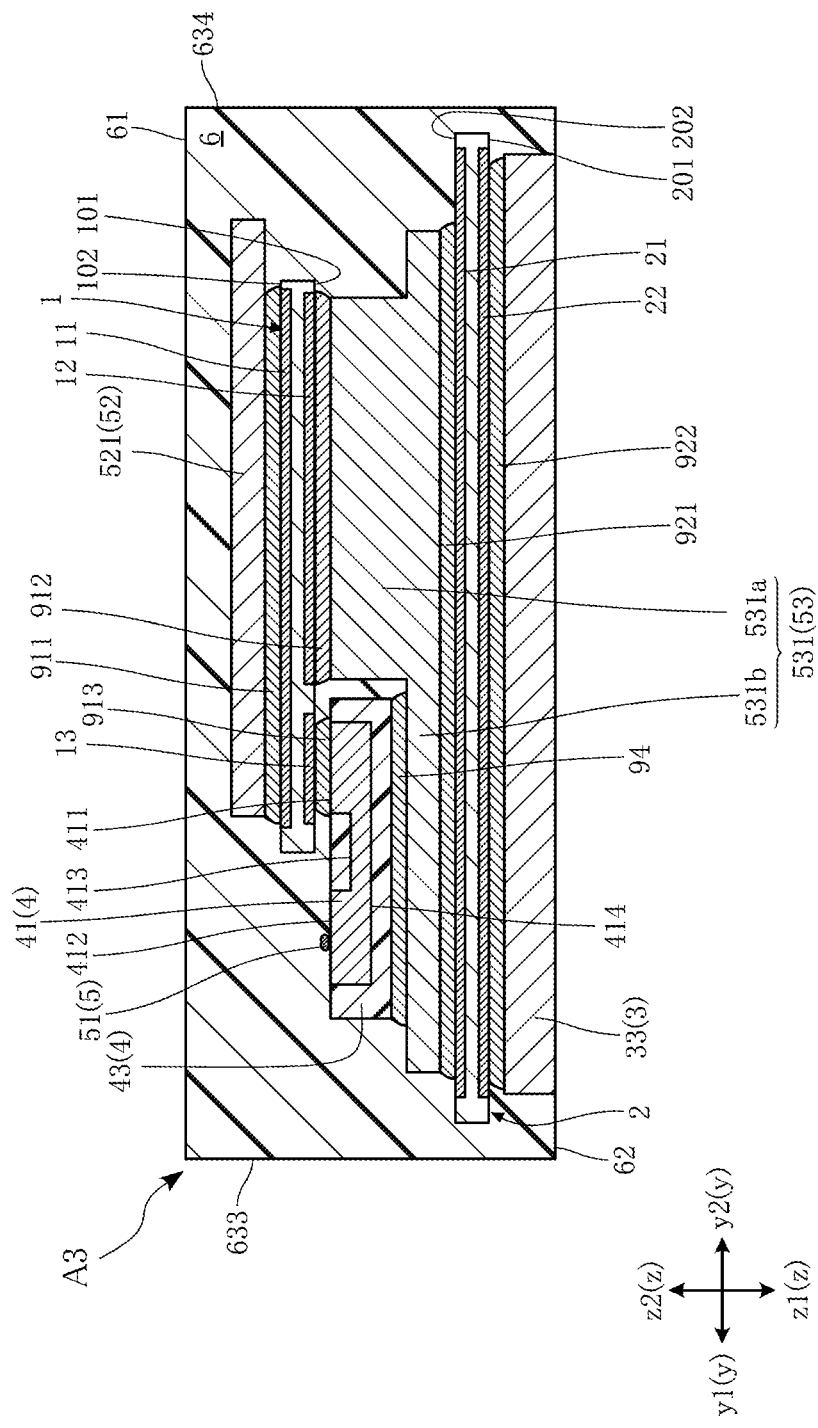
FIG. 16 is a sectional view of a semiconductor device according to a third embodiment.

FIG. 16 shows a semiconductor device A3 according to a third embodiment. FIG. 16 is a sectional view of the semiconductor device A3, corresponding to the section of FIG. 13. As shown in FIG. 16, the semiconductor device A3 differs from the semiconductor device A1 in that the conductor 4 does not include the second conductive member 42 and that the interposed portion 531 of the third connecting member 53 includes a first portion 531a and a second portion 531b.

As shown in FIG. 16, the first portion 531a is larger than the second portion 531b in dimension in the x direction. That is, the first portion 531a is thicker than the second portion 531b. The second electrode 12 is bonded to the upper surface of the first portion 531a with a conductive bonding material 912. The first portion 531a is at the same (or approximately the same) position as the second conductive member 42 of the semiconductor device A1 in plan view. The conductor 4 is bonded to the upper surface of the second portion 531b with a conductive bonding material 94. The upper surface of the first portion 531a and the upper surface of the conductor 4 are located at the same (or approximately the same) position in the z direction.

The semiconductor device A3 provides the same advantages as the semiconductor device A1.

Figure 17:
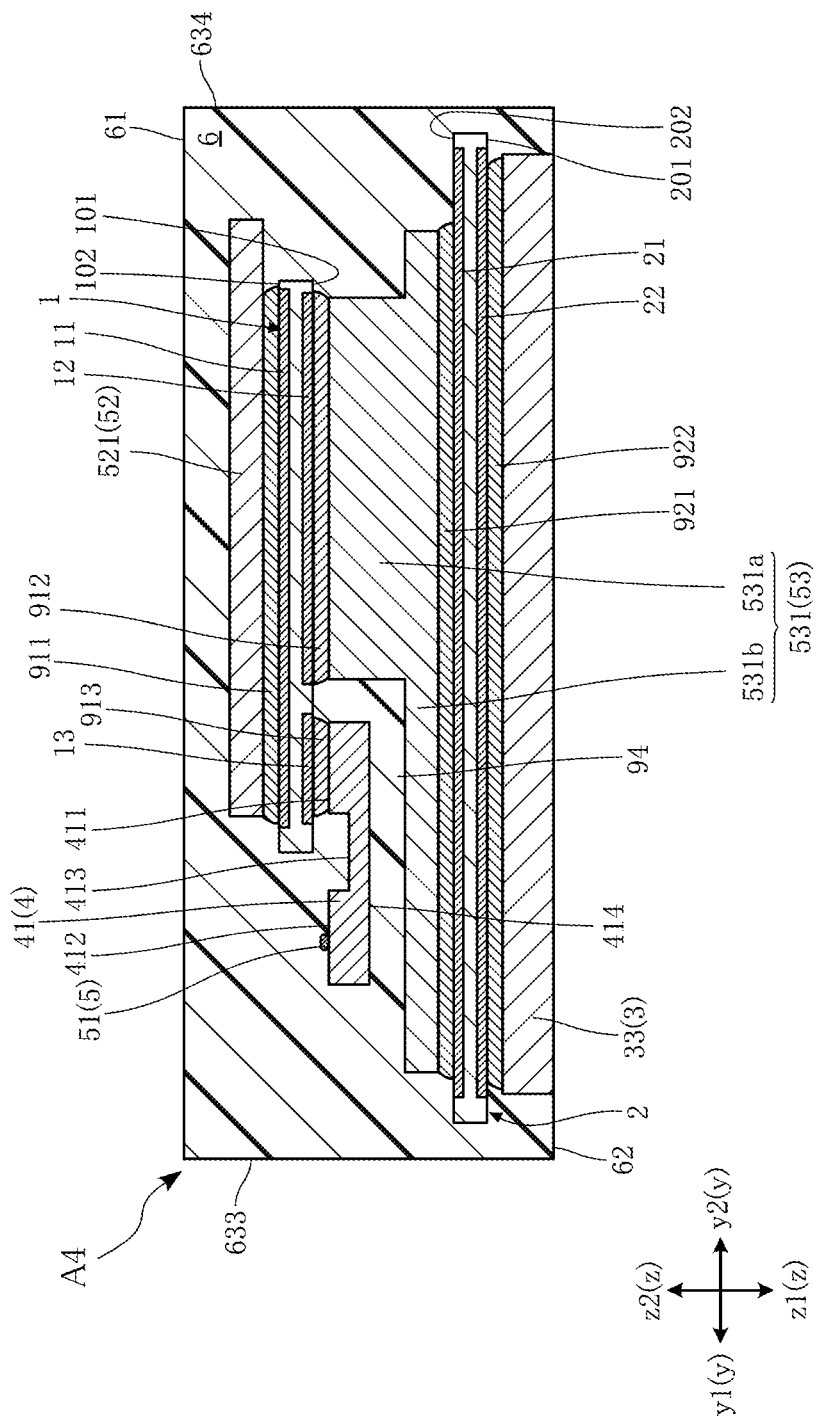
FIG. 17 is a sectional view of a semiconductor device according to a fourth embodiment.

FIG. 17 shows a semiconductor device A4 according to a fourth embodiment. FIG. 17 is a sectional view of the semiconductor device A4, corresponding to the section of FIG. 13. As shown in FIG. 17, the semiconductor device A4 differs from the semiconductor device A3 in that the conductor 4 does not include the resin member 43. As shown in FIG. 17, as with the interposed portion 531 of the semiconductor device A2, the interposed portion 531 of the third connecting member 53 includes a first portion 531a and a second portion 531b.

In the semiconductor device A3, the conductor 4 consists of the first conductive member 41 alone. The first conductive member 41 is covered with the sealing member 6. Thus, in the semiconductor device A3, the covered surface 414 is covered with the sealing member 6. In the semiconductor device A3, the first conductive member 41 is supported while being spaced apart from the third connecting member 53, which is realized by bonding the first conductive member 41 to the third electrode 13 of the first semiconductor element 1 before mounting the first semiconductor element 1 on the first portion 531a (interposed portion 531).

The semiconductor device A4 provides the same advantages as the semiconductor device A1.

Figure 18:
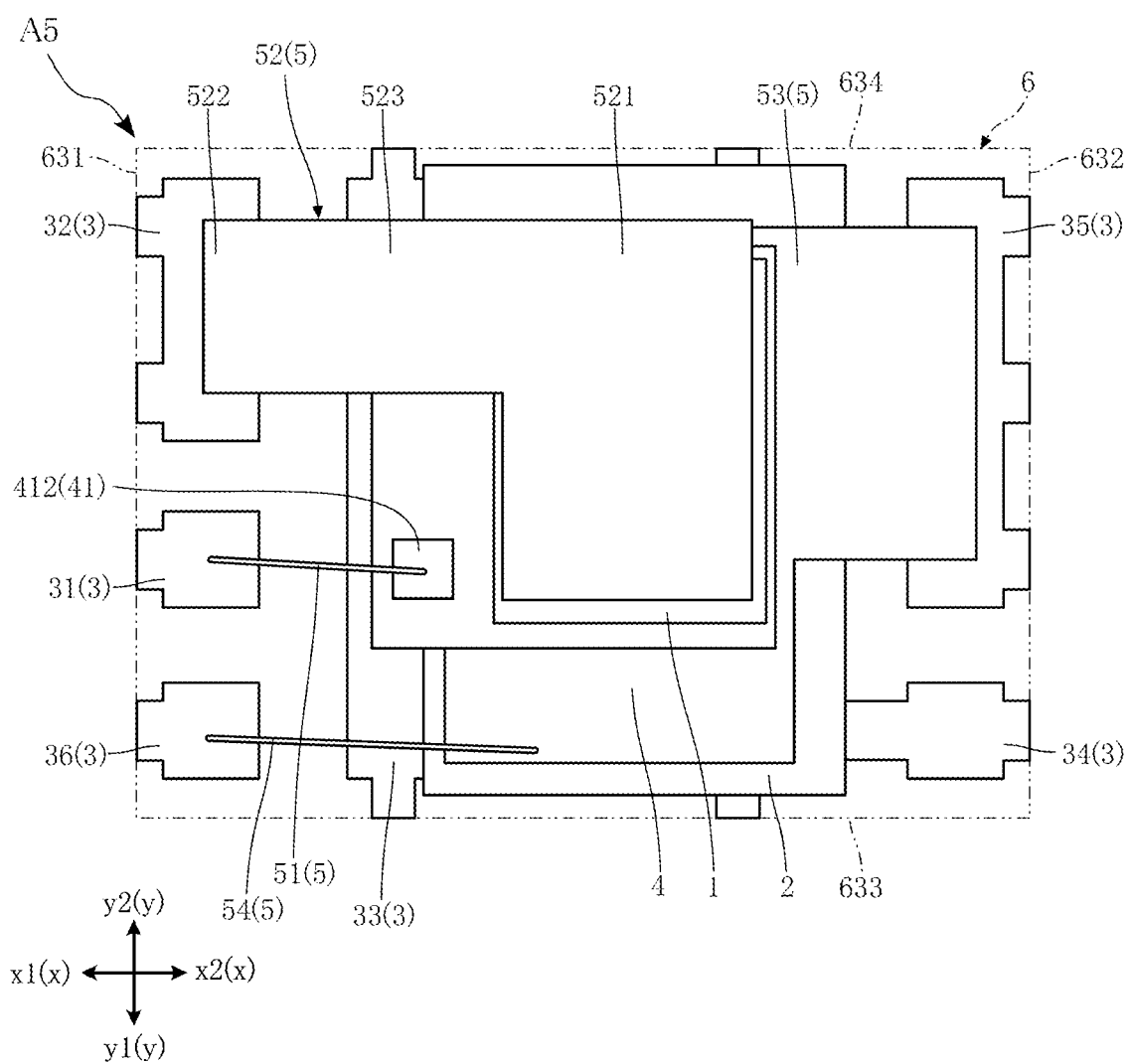
FIG. 18 is a plan view of a semiconductor device according to a fifth embodiment.
Figure 19:
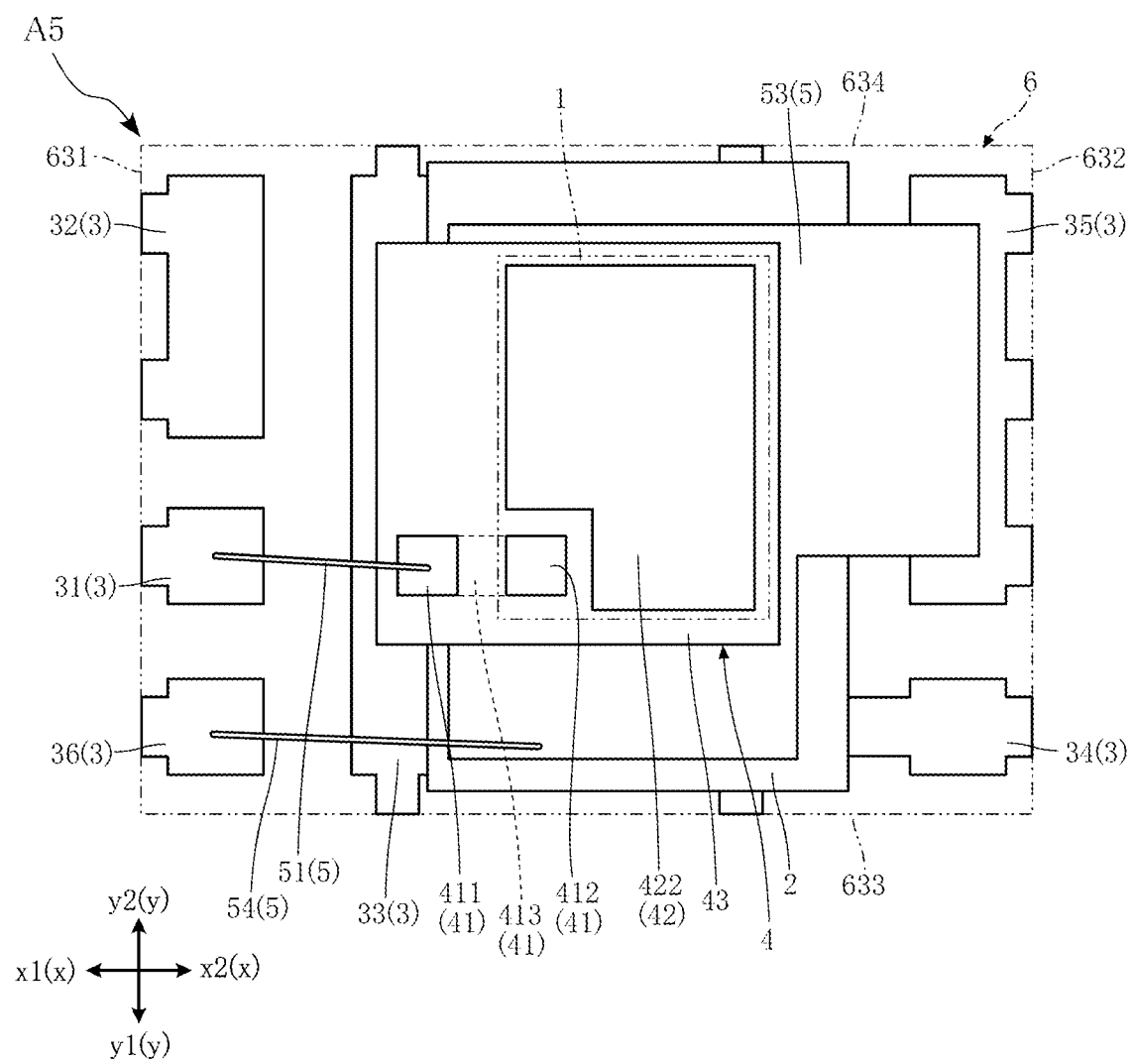
FIG. 19 is a plan view of a semiconductor device according to the fifth embodiment.

FIGS. 18 and 19 show a semiconductor device A5 according to a fifth embodiment. FIGS. 18 and 19 are plan views of the semiconductor device A5. In FIG. 18, the sealing member 6 is shown by imaginary lines. In FIG. 19, the second connecting member 52 is omitted, and the first semiconductor element 1 and the sealing member 6 are shown by imaginary lines. As shown in FIGS. 18 and 19, the semiconductor device A5 differs from the semiconductor device A1 in that the first bond surface 411 and the second bond surface 412 of the first conductive member 41 are spaced apart from each other in the x direction.

As mentioned above, in the semiconductor device A5, the second bond surface 412 is offset from the first bond surface 411 toward one side in the x direction (i.e., in the x1 direction). With such an arrangement, the second bond surface 412 does not overlap with the first semiconductor element 1 and the second connecting member 52 in plan view.

The semiconductor device A5 provides the same advantages as the semiconductor device A1.

Figure 20:
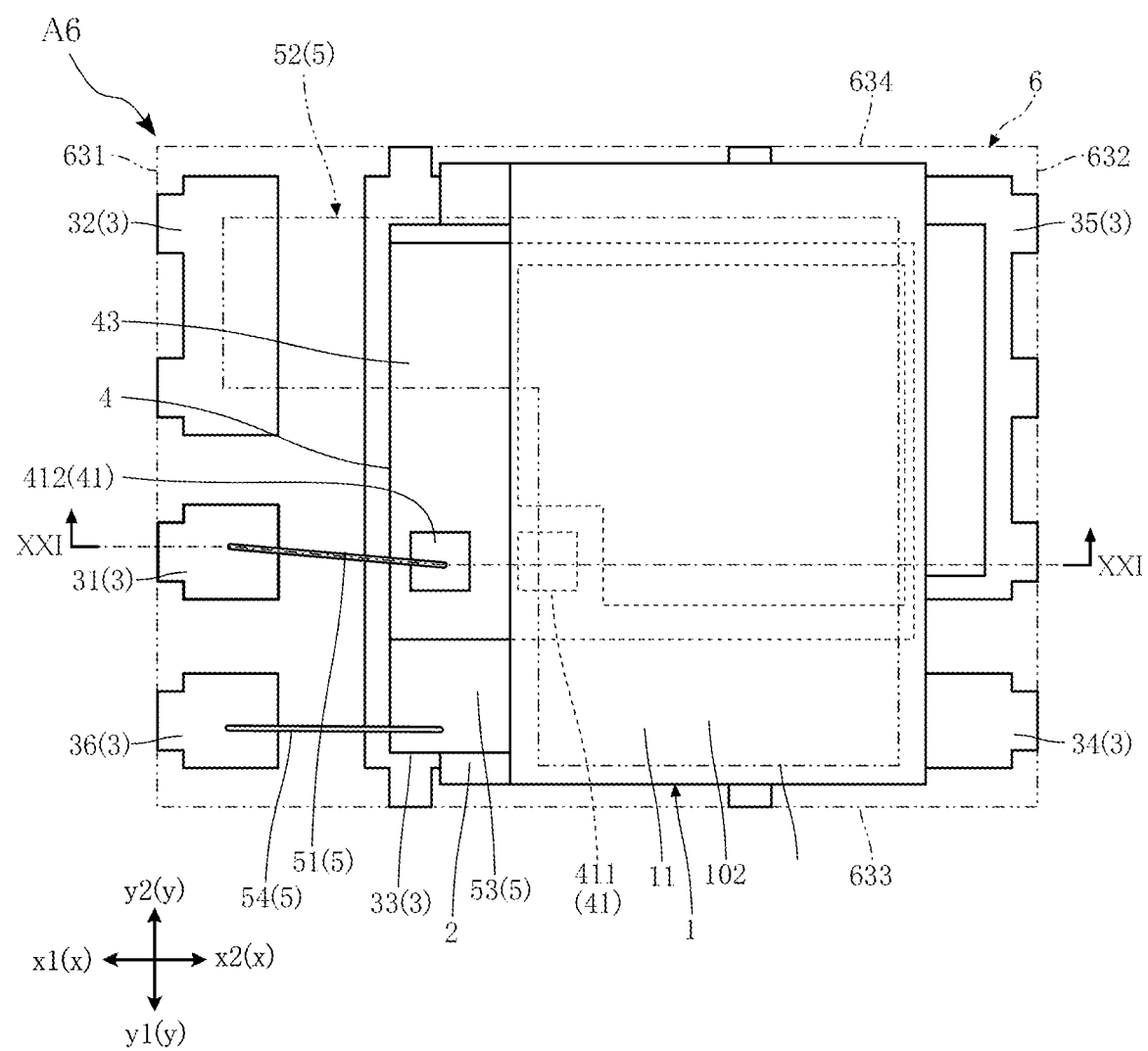
FIG. 20 is a plan view of a semiconductor device according to a sixth embodiment.
Figure 21:
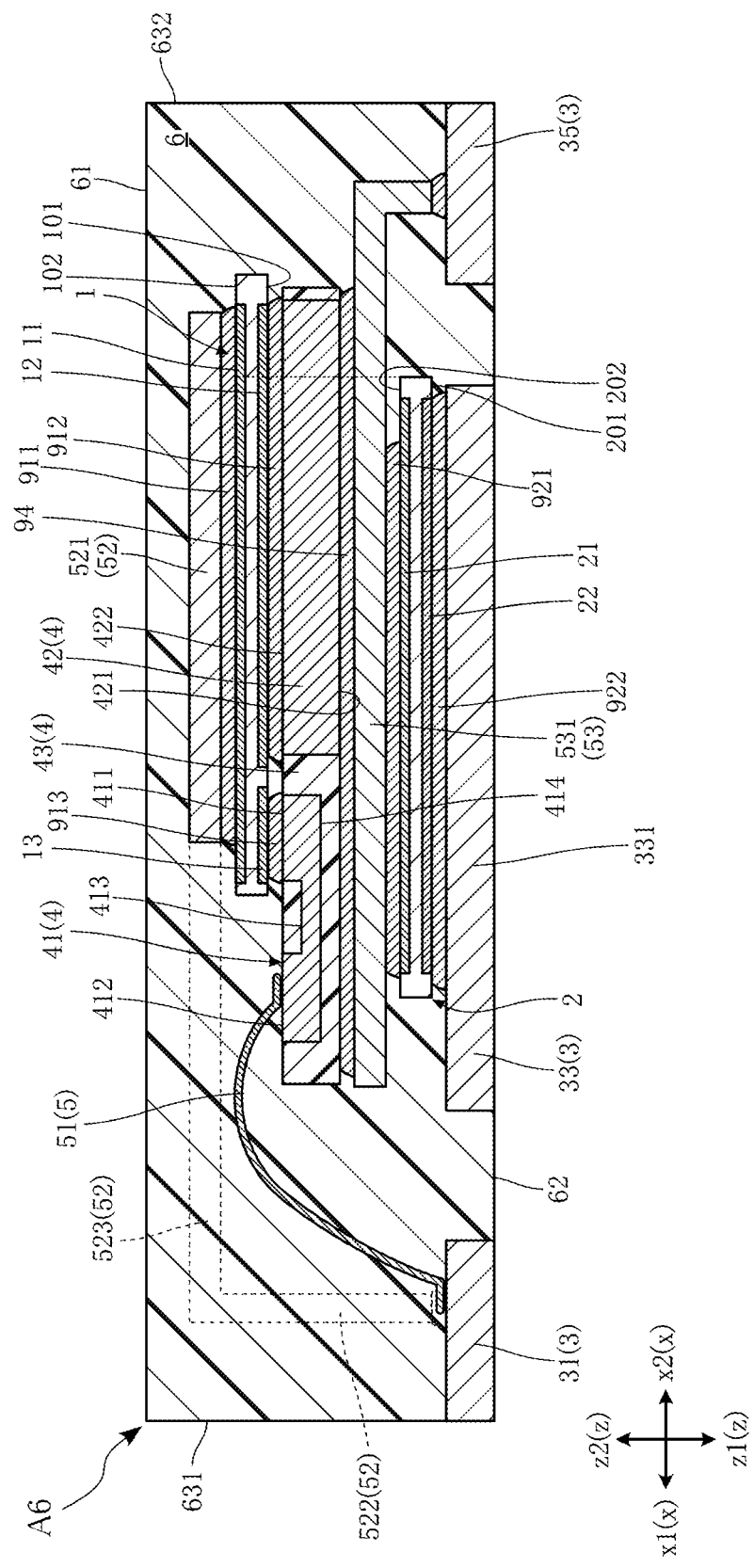
FIG. 21 is a sectional view taken along line XXI-XXI in FIG. 20.

FIGS. 20 and 21 show a semiconductor device A6 according to a sixth embodiment. FIG. 20 is a plan view of the semiconductor device A6, showing the second connecting member 52 and the sealing member 6 by imaginary lines. FIG. 21 is a sectional view taken along line XXI-XXI in FIG. 20. As shown in FIGS. 20 and 21, the semiconductor device A6 differs from the semiconductor device A5 in that the first semiconductor element 1 and the second semiconductor element 2 are the same (or approximately the same) in size in plan view. As with the semiconductor device A5, the semiconductor device A6 employs the first conductive member 41 having the first bond surface 411 and the second bond surface 412 spaced apart from each other along the y direction.

As mentioned above, in the semiconductor device A6, the first semiconductor element 1 and the second semiconductor element 2 are the same (or approximately the same) in size in plan view. In the example shown in FIGS. 20 and 21, the first semiconductor element 1 is slightly offset from the second semiconductor element 2 in the x2 direction.

The semiconductor device A6 provides the same advantages as the semiconductor device A1.

Figure 22:
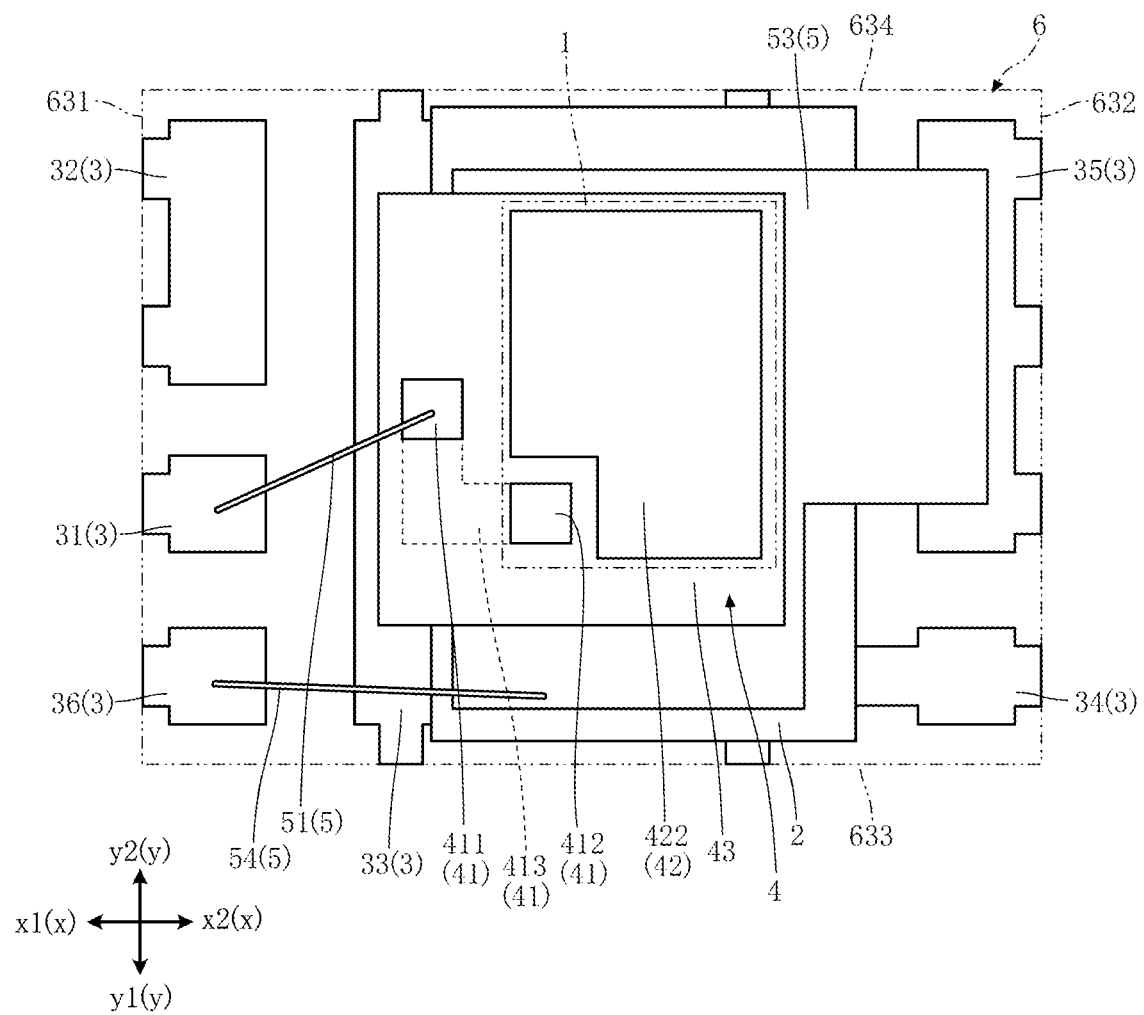
FIG. 22 is a plan view of a semiconductor device according to a variation.

The first through the fourth embodiments show the example in which the first bond surface 411 and the second bond surface 412 are disposed along the y direction, while the firth and the sixth embodiments show the example in which the first bond surface 411 and the second bond surface are disposed along the x direction. However, the arrangement of the first bond surface 411 and the second bond surface 412 may vary as appropriate. FIG. 22 is a plan view corresponding to FIG. 19, showing a semiconductor device according to such a variation. The semiconductor device shown in FIG. 22 is the one in which the position of the second bond surface 412 is changed from that in the semiconductor device A5. The arrangement of each of the first bond surface 411 and the second bond surface 412 may be changed as appropriate according to the shapes and positions of other structural elements by e.g. making the recessed surface 413 have a bent shape in plan view as shown in FIG. 22.

The first through the sixth embodiments show the examples in which the second semiconductor element 2 is a transistor, but the present disclosure is not limited to this, and the second semiconductor element 2 may be a diode or an IC. For example, in the example in which the second semiconductor element 2 is a diode, the second semiconductor element 2 has two electrodes. The two electrodes may be provided one each on the second obverse surface 201 and the second reverse surface 202 or may be provided on either the second obverse surface 201 or the second reverse surface 202. Also, each of the semiconductor devices A1 to A6 may include an electronic component such as a resistor or a capacitor instead of the second semiconductor element 2. Each of the semiconductor devices A1 to A6 may not include the second semiconductor element 2. In such variations, the arrangement, shape and number of the leads 3 may be changed as appropriate.

In the first through the sixth embodiments, each of the semiconductor devices A1 to A6 may include a glass epoxy substrate, a silicon substrate or a ceramic substrate formed with a wiring pattern, instead of the leads 3.

The semiconductor device according to the present disclosure is not limited to the foregoing embodiments. The specific configuration of each part of the semiconductor device according to the present disclosure may be varied in design in many ways. The present disclosure includes the embodiments described in the following clauses.

Clause 1.
  A semiconductor device comprising:
    a first semiconductor element having a first electrode, a second electrode and a third electrode and configured such that current flow between the first electrode and the second electrode is on-off controlled according to a first drive signal inputted to the third electrode;
    a first conductive member bonded to the third electrode; and
    a first connecting member bonded to the first conductive member,
    wherein the first semiconductor element has a first obverse surface and a first reverse surface spaced apart from each other in a thickness direction of the first semiconductor element,
    the second electrode and the third electrode are formed on the first obverse surface,
    the first electrode is formed on the first reverse surface,
    the first conductive member has a first bond surface and a second bond surface each facing in a same direction as the first reverse surface along the thickness direction and spaced apart from each other, and also has a recessed surface recessed in the thickness direction with respect to the first bond surface and the second bond surface,
    the third electrode is bonded to the first bond surface, the first connecting member is bonded to the second bond surface, and the second bond surface does not overlap with the first semiconductor element as viewed in the thickness direction.

Clause 2.
  The semiconductor device according to clause 1, further comprising a plurality of leads disposed offset from the first semiconductor element in a direction in which the first obverse surface faces in the thickness direction,
    wherein the plurality of leads include a first lead to which the first connecting member is connected.

Clause 3.
  The semiconductor device according to clause 2, further comprising a second connecting member bonded to the first electrode,
    wherein the plurality of leads include a second lead to which the second connecting member is bonded, and
    the first electrode and the second lead are electrically connected to each other via the second connecting member.

Clause 4.
  The semiconductor device according to clause 3, further comprising a second semiconductor element having a second obverse surface and a second reverse surface, the second obverse surface facing in the same direction as the first obverse surface in the thickness direction, the second reverse surface facing in the same direction as the first reverse surface in the thickness direction,
    wherein the plurality of leads includes a third lead located opposite to the first semiconductor element with respect to the second semiconductor element in the thickness direction, the second semiconductor element being mounted on the third lead.

Clause 5.
  The semiconductor device according to clause 4, wherein the second semiconductor element includes a fourth electrode and a fifth electrode, the fourth electrode being formed on the second reverse surface and the fifth electrode being formed on the second obverse surface, and
    the fifth electrode is bonded to the third lead.

Clause 6.
  The semiconductor device according to clause 5, wherein the first semiconductor element and the second semiconductor element overlap with each other as viewed in the thickness direction, and
    the second semiconductor element faces the first obverse surface.

Clause 7.
  The semiconductor device according to clause 6, wherein the third electrode overlaps with the second semiconductor element as viewed in the thickness direction.

Clause 8.
  The semiconductor device according to clause 7, wherein the second semiconductor element has a sixth electrode formed on the second obverse surface, and current flow between the fourth electrode and the fifth electrode is on-off controlled according to a second drive signal inputted to the sixth electrode.

Clause 9.
  The semiconductor device according to clause 8, wherein the plurality of leads include a fourth lead to which the sixth electrode is bonded.

Clause 10.
  The semiconductor device according to clause 9, further comprising a third connecting member electrically connected to the second electrode and the fourth electrode, wherein the plurality of leads include a fifth lead bonded to the third connecting member, and the second electrode and the fourth electrode are electrically connected to the fifth lead via the third connecting member.

Clause 11.

The semiconductor device according to clause 10, further comprising an insulating resin member covering the first conductive member, wherein the first conductive member has a covered surface facing away from the first bond surface and the second bond surface and covered with the resin member, and the second bond surface is exposed from the resin member.

Clause 12.

The semiconductor device according to clause 11, further comprising a second conductive member located between the first semiconductor element and the semiconductor element in the thickness direction and insulated from the first conductive member, wherein the second electrode and the fourth electrode are electrically connected to each other via the second conductive member.

Clause 13.

The semiconductor device according to clause 12, wherein the third connecting member is located between the second conductive member and the fourth electrode in the thickness direction, and the second conductive member and the fourth electrode are electrically connected to each other via the third connecting member.

Clause 14.

The semiconductor device according to clause 13, wherein the resin member covers the second conductive member, the second conductive member has a first end surface bonded to the third connecting member, and the first end surface is exposed from the resin member.

Clause 15.

The semiconductor device according to clause 14, wherein the second conductive member has a second end surface bonded to the second electrode, the second end surface is exposed from the resin member, and the second end surface and the second bond surface are in a same plane perpendicular to the thickness direction.

Clause 16.

The semiconductor device according to clause 14, wherein the resin member covers the first semiconductor element, and the second bond surface and the first reverse surface are in a same plane perpendicular to the thickness direction.

Clause 17.

The semiconductor device according to any of clauses 12 to 16, further comprising a sealing member covering the first semiconductor element, the second semiconductor element, the first conductive member and the second conductive member.

REFERENCE CHARACTERS

A1 to A6: Semiconductor device 1: First semiconductor element
101: First obverse surface 102: First reverse surface
11: First electrode 12: Second electrode
13: Third electrode 2: Second semiconductor element
201: Second obverse surface 202: Second reverse surface
21: Fourth electrode 22: Fifth electrode
23: Sixth electrode 3: Lead
31: First lead 32: Second lead
33: Third lead 331: Pad portion
332: Suspending portion 34: Fourth lead
341: Pad portion 35: Fifth lead
36: Sixth lead 4: Conductor
41: First conductive member 411: First bond surface
412: Second bond surface 413: Recessed surface
414: Covered surface 42: Second conductive member
421: First end surface 422: Second end surface
43: Resin member 5: Connecting member
51: First connecting member 52: Second connecting member
521: Bond portion 522: Bond portion
523: Joining portion 53: Third connecting member
531: Interposed portion 531a: First portion
531b: Second portion 532: Bond portion
533: Joining portion 54: Fourth connecting member
6: Sealing member 61: Resin obverse surface
62: Resin reverse surface 631 to 634: Resin side surface
911 to 913, 921 to 923, 94, 952, 953: Conductive bonding material

The invention claimed is:

1. A semiconductor device comprising:
a first semiconductor element having a first electrode, a second electrode and a third electrode and configured such that current flow between the first electrode and the second electrode is on-off controlled according to a first drive signal inputted to the third electrode;
a first conductive member bonded to the third electrode; and
a first connecting member bonded to the first conductive member,
wherein the first semiconductor element has a first obverse surface and a first reverse surface spaced apart from each other in a thickness direction of the first semiconductor element,
the second electrode and the third electrode are formed on the first obverse surface,
the first electrode is formed on the first reverse surface,
the first conductive member has a first bond surface and a second bond surface each facing in a same direction as the first reverse surface along the thickness direction and spaced apart from each other, and also has a recessed surface recessed in the thickness direction with respect to the first bond surface and the second bond surface,
the third electrode is bonded to the first bond surface,
the first connecting member is bonded to the second bond surface, and the second bond surface does not overlap with the first semiconductor element as viewed in the thickness direction.

2. The semiconductor device according to claim 1, further comprising a plurality of leads disposed offset from the first semiconductor element in a direction in which the first obverse surface faces in the thickness direction,
wherein the plurality of leads include a first lead to which the first connecting member is connected.

3. The semiconductor device according to claim 2, further comprising a second connecting member bonded to the first electrode,
wherein the plurality of leads include a second lead to which the second connecting member is bonded, and the first electrode and the second lead are electrically connected to each other via the second connecting member.

4. The semiconductor device according to claim 3, further comprising a second semiconductor element having a second obverse surface and a second reverse surface, the second obverse surface facing in the same direction as the first obverse surface in the thickness direction, the second reverse surface facing in the same direction as the first reverse surface in the thickness direction,
wherein the plurality of leads includes a third lead located opposite to the first semiconductor element with respect to the second semiconductor element in the thickness direction, the second semiconductor element being mounted on the third lead.

5. The semiconductor device according to claim 4, wherein the second semiconductor element includes a fourth electrode and a fifth electrode, the fourth electrode being formed on the second reverse surface and the fifth electrode being formed on the second obverse surface, and
the fifth electrode is bonded to the third lead.

6. The semiconductor device according to claim 5, wherein the first semiconductor element and the second semiconductor element overlap with each other as viewed in the thickness direction, and
the second semiconductor element faces the first obverse surface.

7. The semiconductor device according to claim 6, wherein the third electrode overlaps with the second semiconductor element as viewed in the thickness direction.

8. The semiconductor device according to claim 7, wherein the second semiconductor element has a sixth electrode formed on the second obverse surface, and current flow between the fourth electrode and the fifth electrode is on-off controlled according to a second drive signal inputted to the sixth electrode.

9. The semiconductor device according to claim 8, wherein the plurality of leads include a fourth lead to which the sixth electrode is bonded.

10. The semiconductor device according to claim 9, further comprising a third connecting member electrically connected to the second electrode and the fourth electrode,
wherein the plurality of leads include a fifth lead bonded to the third connecting member, and
the second electrode and the fourth electrode are electrically connected to the fifth lead via the third connecting member.

11. The semiconductor device according to claim 10, further comprising an insulating resin member covering the first conductive member,
wherein the first conductive member has a covered surface facing away from the first bond surface and the second bond surface and covered with the resin member, and
the second bond surface is exposed from the resin member.

12. The semiconductor device according to claim 11, further comprising a second conductive member located between the first semiconductor element and the semiconductor element in the thickness direction and insulated from the first conductive member,
wherein the second electrode and the fourth electrode are electrically connected to each other via the second conductive member.

13. The semiconductor device according to claim 12, wherein the third connecting member is located between the second conductive member and the fourth electrode in the thickness direction, and
the second conductive member and the fourth electrode are electrically connected to each other via the third connecting member.

14. The semiconductor device according to claim 13, wherein the resin member covers the second conductive member,
the second conductive member has a first end surface bonded to the third connecting member, and
the first end surface is exposed from the resin member.

15. The semiconductor device according to claim 14, wherein the second conductive member has a second end surface bonded to the second electrode,
the second end surface is exposed from the resin member, and
the second end surface and the second bond surface are in a same plane perpendicular to the thickness direction.

16. The semiconductor device according to claim 14, wherein the resin member covers the first semiconductor element, and
the second bond surface and the first reverse surface are in a same plane perpendicular to the thickness direction.

17. The semiconductor device according to claim 12, further comprising a sealing member covering the first semiconductor element, the second semiconductor element, the first conductive member and the second conductive member.

* * * * *